(12) United States Patent
George et al.

(10) Patent No.: US 7,948,034 B2
(45) Date of Patent: May 24, 2011

(54) APPARATUS AND METHOD FOR SEMICONDUCTOR BONDING

(75) Inventors: Gregory George, Colchester, VT (US); Etienne Hancock, Morrisville, VT (US); Robert Campbell, Manchester, NH (US)

(73) Assignee: Suss Microtec Lithography, GmbH, Garching (DE)

( * ) Notice: Subject to any disclaimer, the term of this patent is extended or adjusted under 35 U.S.C. 154(b) by 578 days.

(21) Appl. No.: 11/766,531

(22) Filed: Jun. 21, 2007

(65) Prior Publication Data
US 2007/0296035 A1    Dec. 27, 2007

Related U.S. Application Data

(60) Provisional application No. 60/815,619, filed on Jun. 22, 2006.

(51) Int. Cl.
*H01L 27/12* (2006.01)

(52) U.S. Cl. ........................................ 257/347

(58) Field of Classification Search .................... 257/347
See application file for complete search history.

(56) References Cited

U.S. PATENT DOCUMENTS

| | | | | |
|---|---|---|---|---|
| 5,273,553 | A | * | 12/1993 | Hoshi et al. .................. 29/25.01 |
| 7,064,055 | B2 | | 6/2006 | Reif et al. |
| 7,168,607 | B2 | * | 1/2007 | Ehrke et al. .................. 228/207 |
| 7,645,681 | B2 | * | 1/2010 | Okada ........................... 438/455 |
| 2005/0074927 | A1 | * | 4/2005 | Hsieh et al. .................. 438/143 |

* cited by examiner

*Primary Examiner* — Charles D Garber
*Assistant Examiner* — Stanetta D Isaac
(74) *Attorney, Agent, or Firm* — AKC Patents LLC; Aliki K. Collins

(57) ABSTRACT

An apparatus for bonding semiconductor structures includes equipment for positioning a first surface of a first semiconductor structure directly opposite and in contact with a first surface of a second semiconductor structure and equipment for forming a bond interface area between the first surfaces of the first and second semiconductor structures by pressing the first and second semiconductor structures together with a force column configured to apply uniform pressure to the entire bond interface area between the first surfaces.

39 Claims, 20 Drawing Sheets

FEA- DISPLACEMENT

FEA -VON MISES STRESS

FEA- DISPLACEMENT

FEA -VON MISES STRESS

APPARATUS AND METHOD FOR SEMICONDUCTOR BONDING

CROSS REFERENCE TO RELATED CO-PENDING APPLICATIONS

This application claims the benefit of U.S. provisional application Ser. No. 60/815,619 filed Jun. 22, 2006 and entitled "HIGH-FORCE BOND TOOL", the contents of which are expressly incorporated herein by reference.

FIELD OF THE INVENTION

The present invention relates to an apparatus and a method for semiconductor bonding, and more particularly to a high force semiconductor bonding apparatus and method.

BACKGROUND OF THE INVENTION

Consumers desire ever cheaper electrical and electronic devices. A major part of the cost in producing consumer electrical and electronic devices is the cost of the semiconductor devices that provide the very features that make the electronic devices so desired by consumers. Manufacturers of the semiconductor devices thus continue to seek ways to lessen manufacturing costs of the semiconductors. A significant factor in the determination of unit cost for semiconductor devices is defects that may present themselves in a given production lot. As may be realized, loss of semiconductor devices through defects presents a fiscal loss to manufacturers that may generally be accommodated by increasing unit price. An area where defects may be introduced in fabrication of semiconductor devices is in the wafer of substrate bonding. Wafer bonding involves applying heat, force, and sometimes voltage to an aligned stack of two or ore wafers in a controlled atmosphere. The goal of any wafer bonding is to produce high integrity bonds, uniformly across the entire wafer area without negatively influencing the wafer to wafer alignment. Improved bonding integrity has been achieved by generating higher interfacial pressures. For improved bonding results, the interfacial pressure can be quite high, and hence it is desired that substantial force be applied to the wafers to be bonded. For example 90 KN on a 200 mm diameter wafer or 100 KN on a 300 mm diameter wafer. However, although enabling the bond, the high forces also cause flex and distortion of conventional bonding tools that apply the forces, resulting in poor interfacial pressure uniformity, bond quality variability and wafer shift and defeating the improvements sought by using high bonding forces. In conventional systems the pressure non-uniformity approaches 50% across the bond interface.

Accordingly, it would be desirable to provide a bonding apparatus that could apply uniform pressure across the entire bond interface.

SUMMARY OF THE INVENTION

In general, in one aspect, the invention features an apparatus for bonding semiconductor structures including equipment for positioning a first surface of a first semiconductor structure directly opposite and in contact with a first surface of a second semiconductor structure and equipment for forming a bond interface area between the first surfaces of the first and second semiconductor structures by pressing the first and second semiconductor structures together with a force column configured to apply uniform pressure to the entire bond interface area between the first surfaces.

Implementations of this aspect of the invention may include one or more of the following features. The force column comprises a plurality of forces arranged in a column having a base dimensioned to match the entire bond interface area between the first surfaces. The base's dimensions may be adjustable and may be adjusted to match bond interface areas having a diameter of 4 inches, 6 inches or 8 inches. The force column applies the pressure to the entire bond interface area with a uniformity of at least 90 percent. The pressure may be in the range of 1000 to 50000 mbars. The bond forming equipment includes an actuator configured to generate the force column. The actuator may be a solid plate driven by a pressurized gas or a pressurized fluid or a magnet. The positioning equipment comprises a clamp having a first clamp member configured to be brought in contact with a second surface of the first semiconductor structure and a second clamp member configured to be brought in contact with a second surface of the second semiconductor structure. The second surfaces of the first and second semiconductor structures are opposite to the first surfaces of the first and second semiconductor structures, respectively. Pressing the first and second semiconductor structures together with the force column comprises pressing at least one of the first and second clamp members with the force column. The apparatus may further include a frame configured to bear the load of the positioning and bond forming equipment. The frame may include at least one rigid post and the first and second clamp members are configured to be connected to the post so as to transfer any bending moments generated during the bonding of the semiconductor structures to the frame. Any or both of the first and second clamp members are movably connected to the rigid post. In one embodiment the frame comprises three rigid posts. The frame may further include top and bottom plates and the plates may be connected to the rigid posts. The apparatus may further include a controlled atmosphere chamber. The apparatus may further include a carrier fixture configured to transport the first and second semiconductor structures in and out of the chamber and to place the first and second semiconductor structures between the clamp members. The carrier fixture may include at least one spacer configured to maintain the first surfaces of the first and second semiconductor structures at a first distance. The carrier fixture may also have at least one clamp for clamping the first and second semiconductor structures together. The at least one spacer and the at least one clamp are independently actuated. The apparatus may further include a pin configured to stake the first surfaces of the first and second semiconductor structures before pressing the first and second semiconductor structures together with the force column. The pin stakes the first surfaces of the first and second semiconductor structures with an adjustable force. The chamber comprises a port dimensioned to allow transport of the carrier fixture in and out of the chamber. The apparatus may further include a pre-load chamber configured to communicate with the chamber via the port and the port may have a shutter for isolating the pre-load chamber from the chamber. The apparatus may also include a pressure gauge configured to monitor pressure in the chamber. The apparatus may further include equipment for aligning a first surface of the first clamp member parallel to a first surface of the second clamp member. The first surface of the first clamp member is configured to be brought in contact with the second surface of the first semiconductor structure and the first surface of the second clamp member is configured to be brought in contact with the second surface of the second semiconductor structure. The aligning equipment are configured to align the first and second semiconductor structures so that the force column is applied perpendicular to the bond interface area. The aligning equipment may include a linear alignment tool and a rotational alignment tool. The rotational aligning equipment is configured to rotationally align any of the first surfaces around a center of the bond interface area. The apparatus may further include equipment for heating the first and second semiconductor structures to reach a temperature uniformity of ±1 degree throughout the entire bond interface area. The apparatus may further include a thermal isolation system configured to thermally isolate the first and second semiconductor structures from the positioning and bond forming equipment. The thermal isolation system includes a vacuum isolation layer confined between an elastic membrane and a substrate comprising a low coefficient of thermal expansion (CTE) material. The low CTE substrate comprises a surface structured to minimize contact with the membrane. The heating equipment may include independently controlled multi-zone heaters configured to independently heat center and periphery regions of the first and second semiconductor structures. The heating equipment may include a first set of heaters configured to heat the first semiconductor substrate and a second set of heaters configured to heat the second semiconductor substrate and wherein the first set of heaters is arranged in a mirror image configuration of the second set of heaters. The semiconductor structures may be semiconductor wafers, flat panel structures, integrated circuit devices, 3D integrated microelectronics or Micro-Electro-Mechanical-Systems (MEMS). The first surfaces of the first and second semiconductor structures may further comprise first and second bond layers, respectively, and the first and second bond layers may be metal, semiconductor, insulator, adhesive, grid structures, glass, or insulators. The bonding may be anodic, eutectic, adhesive, fusion, glass frit or thermocompression bond.

In general, in another aspect, the invention features a method for bonding semiconductor structures including positioning a first surface of a first semiconductor structure directly opposite and in contact with a first surface of a second semiconductor structure and then forming a bond interface area between the first surfaces of the first and second semiconductor structures by pressing the first and second semiconductor structures together with a force column configured to apply uniform pressure to the entire bond interface area between the first surfaces.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

Figure 1:
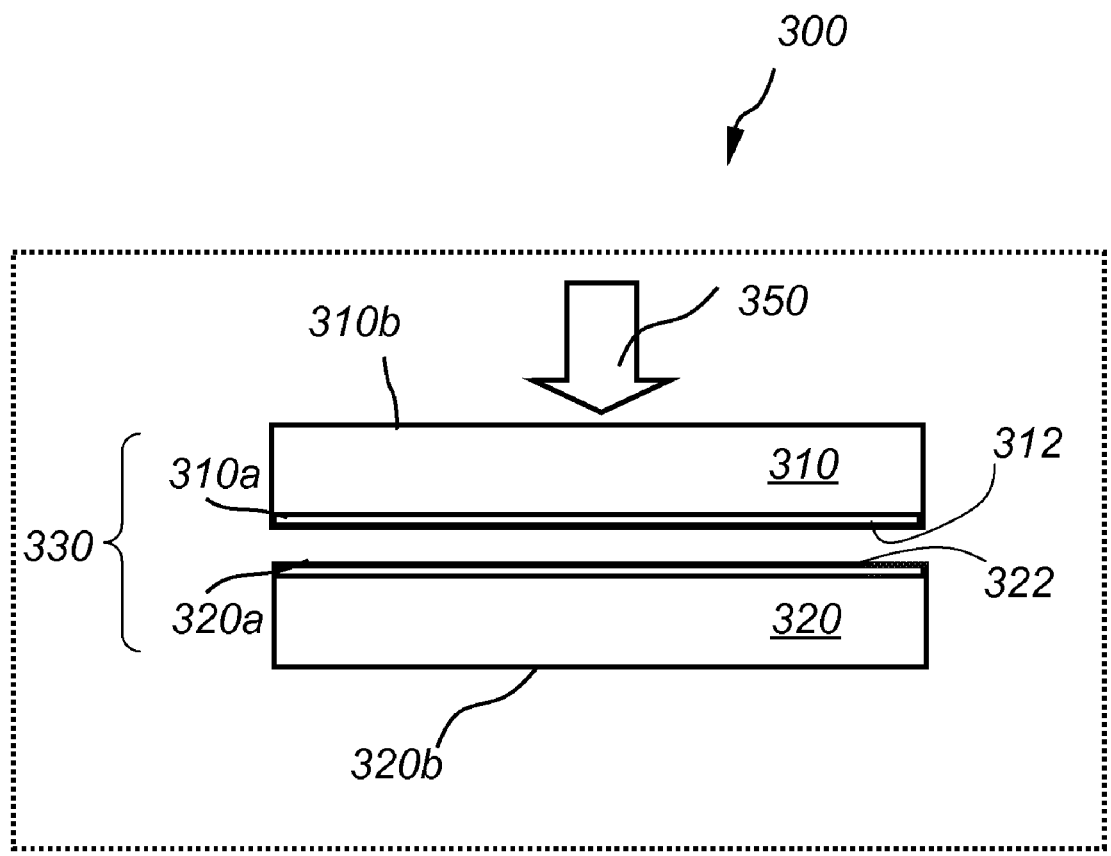
FIG. 1 is a schematic diagram of a prior art wafer bonding system.
Figure 2A:
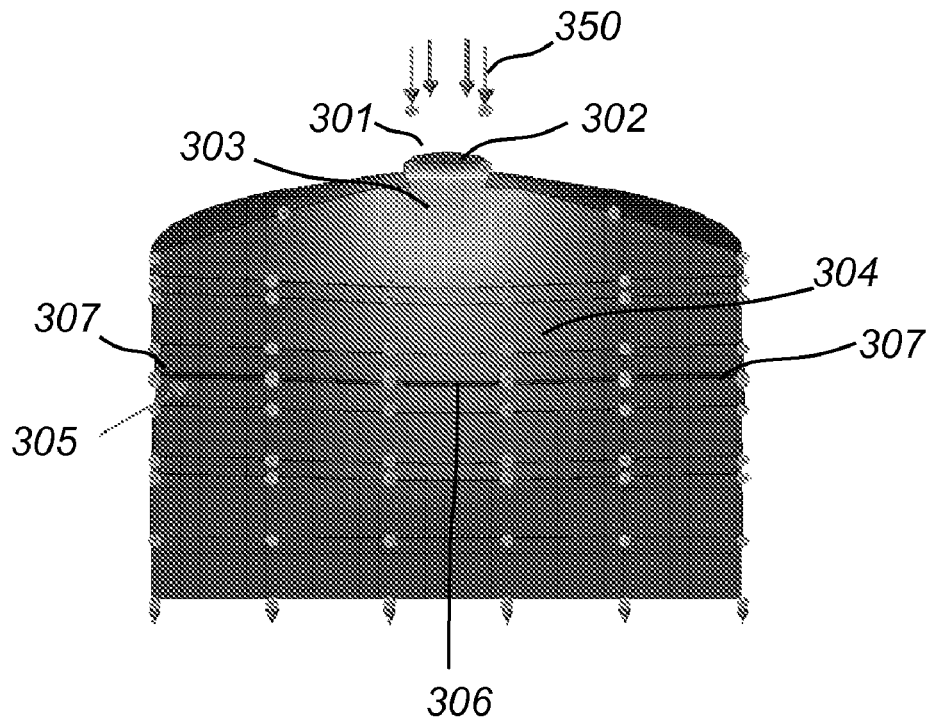
FIG. 2A is a finite element analysis result displaying the displacement along the bond interface for the prior art wafer bonding system of FIG. 1.
Figure 2B:
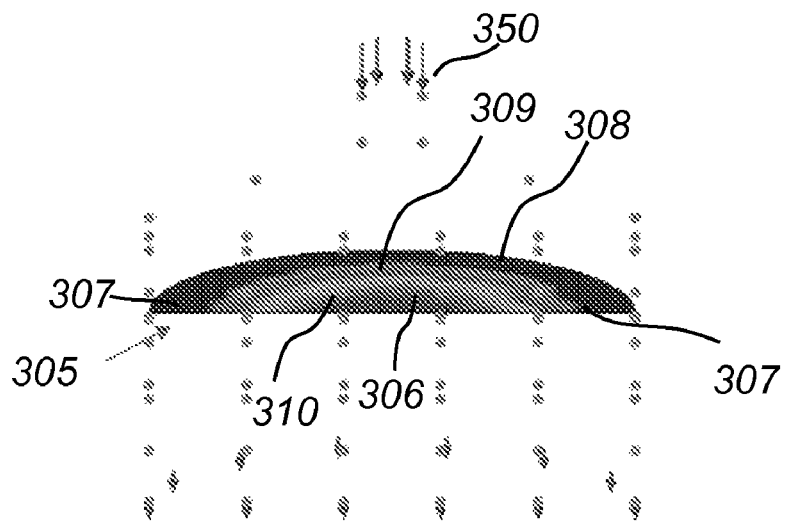
FIG. 2B is a finite element analysis result displaying the Von Mises stress along the bond interface for the prior art wafer bonding system of FIG. 1.

Referring to FIG. 1 in a prior art wafer bonding system 300 a first wafer 310 having a bond layer 312 on a first surface 310a is brought into contact with a second wafer 320 having a bond layer 322 on a first surface 320a, so that the two bond layers 312 and 322 are opposite to each other. The wafer bonding process involves compressing the two wafers together by applying a force 350 on a second surface 310b of the first wafer 310. Force 350 is usually applied to the center of the wafer stack 302 with a piston-type mechanism, as shown in FIG. 1. In other embodiments force 350 may be applied in the periphery of the wafer stack 302 or a second force may be applied simultaneously with the force 350 on the second surface 320b of the second wafer 320. Finite element analysis (FEA) of the displacement along the bond interface 305 is shown in FIG. 2A. We observe the formation of a "hot pressure spot" directly underneath the central area 301 where the force 350 is applied. A first spherical area 302 directly underneath the central area 301 has a displacement of the order of 30μ. Directly under area 302 is another spherical area 303 where the displacement is of the order of a 2-3μ and directly under area 303 is area 304 where the displacement is in the range of 1μ. The spherical front of the "hot pressure spot" propagates down to the bond interface 305 and causes the central region 306 to be more bowed than the edge regions 307. As we mentioned above, the pressure non uniformity across the bond interface can reach up to 50%. The Von Mises stresses of the FEA are shown in FIG. 2B. We observe again a spherical stress front propagating down to the bond interface 305 where is causes stress variations between the central 306 and periphery regions 307. Areas 308, 309 and 311 have stresses of the order of 100 Factor of Safety (FOS), 50 FOS and 10 FOS, respectively.

Figure 3:
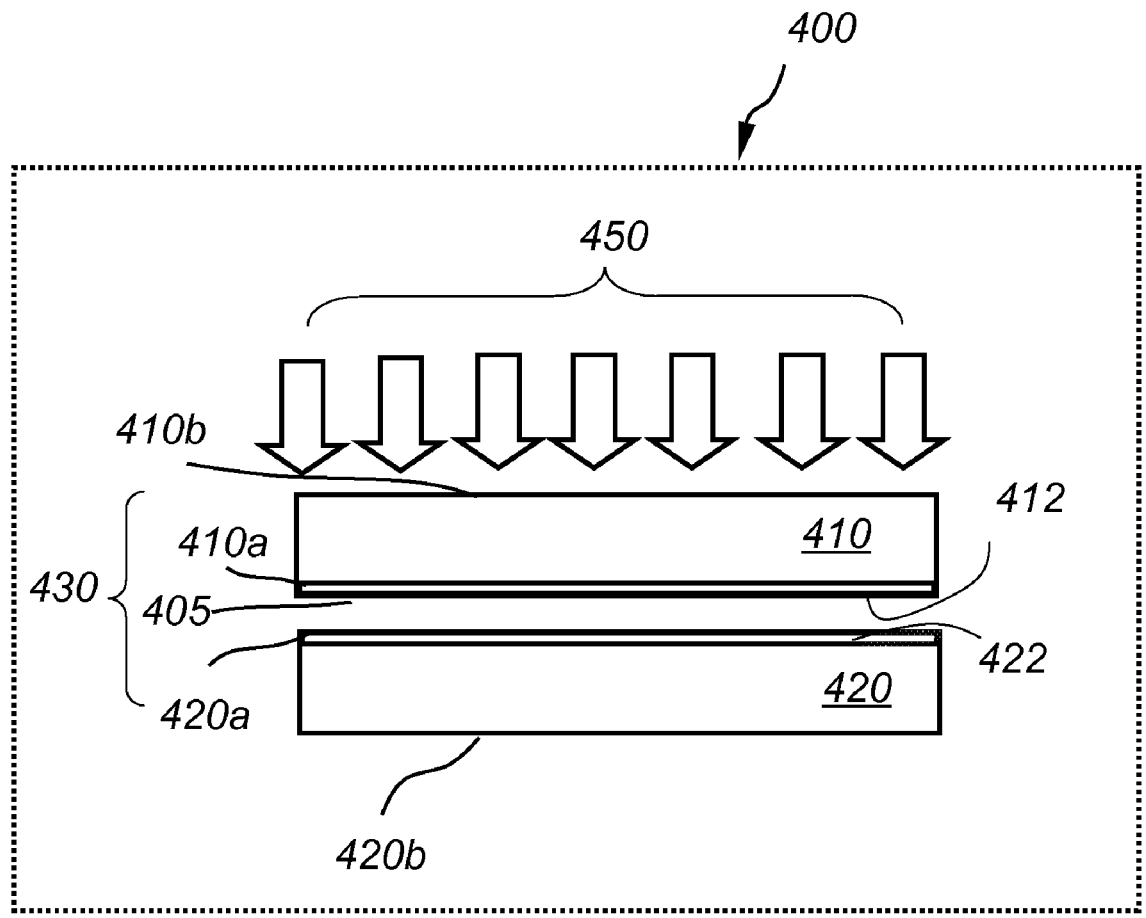
FIG. 3 is a schematic diagram of a wafer bonding system according to this invention.
Figure 4A:
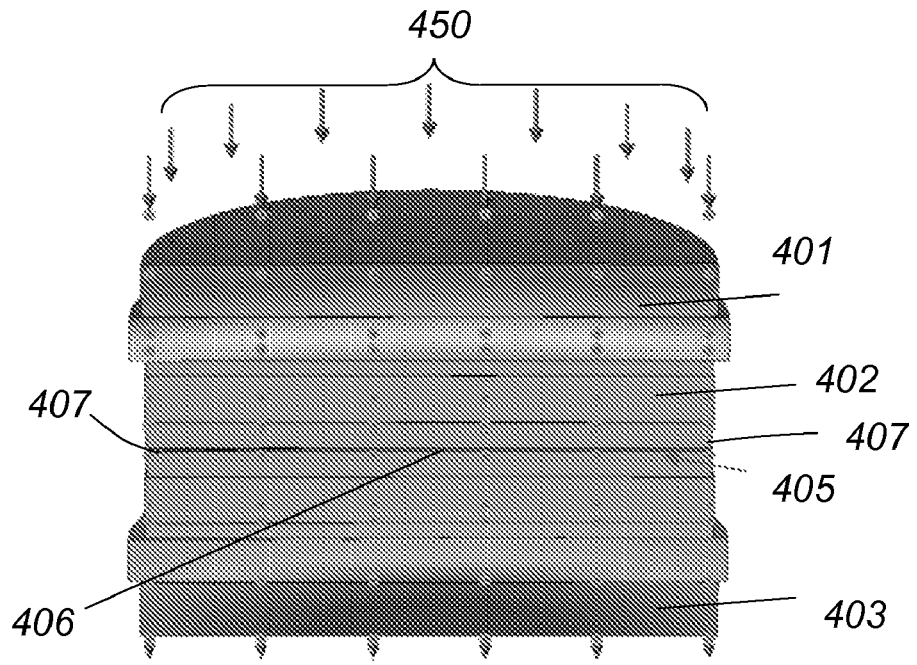
FIG. 4A is a finite element analysis result displaying the displacement along the bond interface for the wafer bonding system of FIG. 3.
Figure 4B:
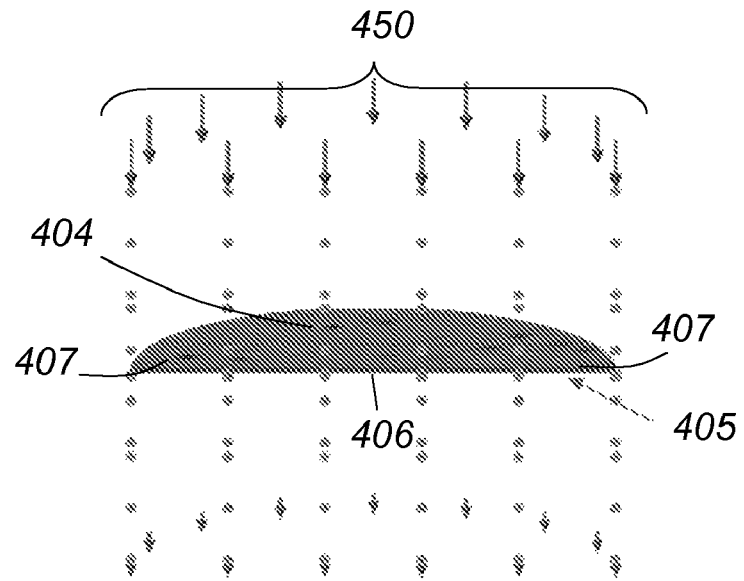
FIG. 4B is a finite element analysis result displaying the Von Mises stress along the bond interface for the wafer bonding system of FIG. 3.
Figure 5:
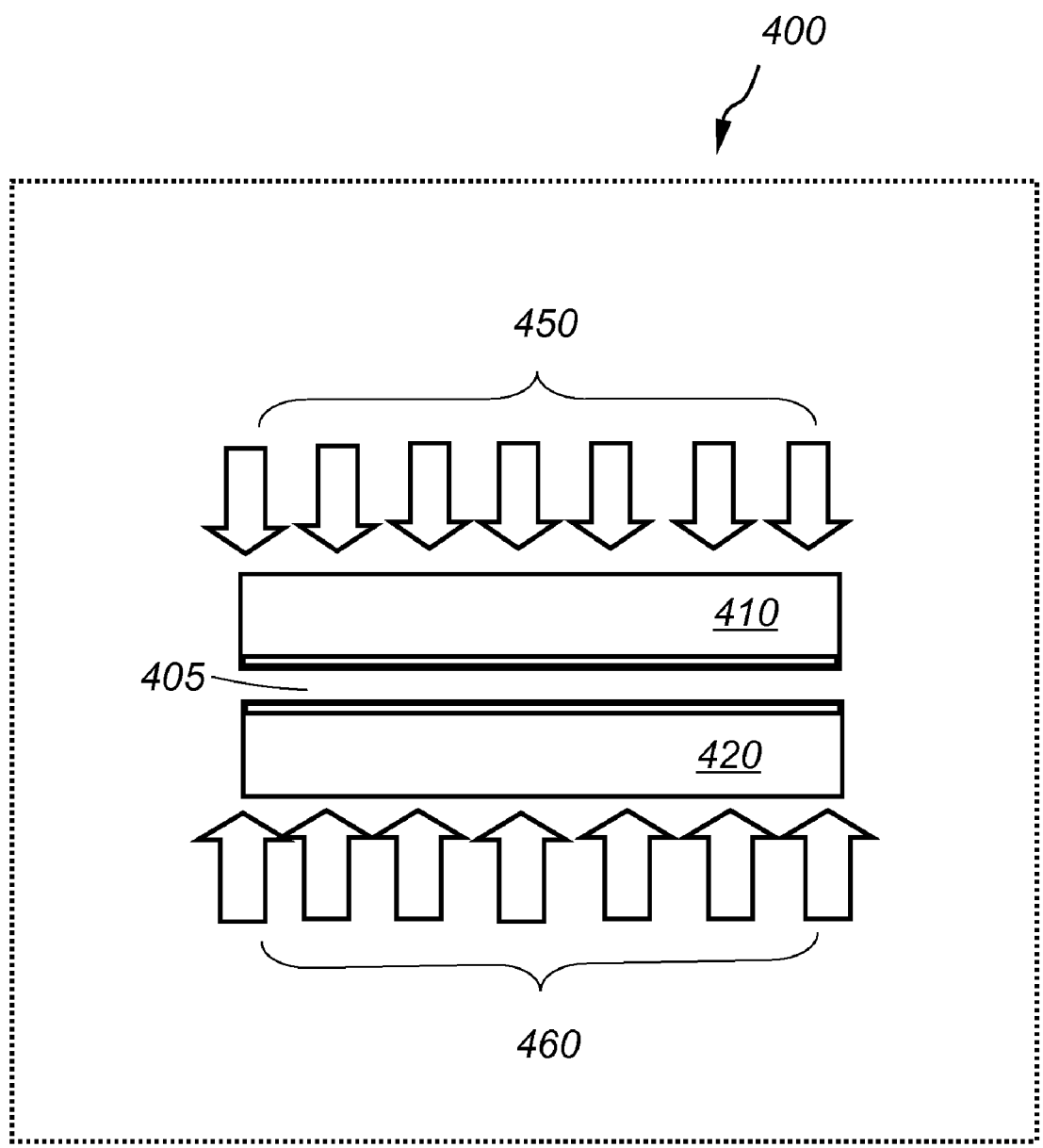
FIG. 5 is a schematic diagram of another embodiment of the wafer bonding system according to this invention.
Figure 6:
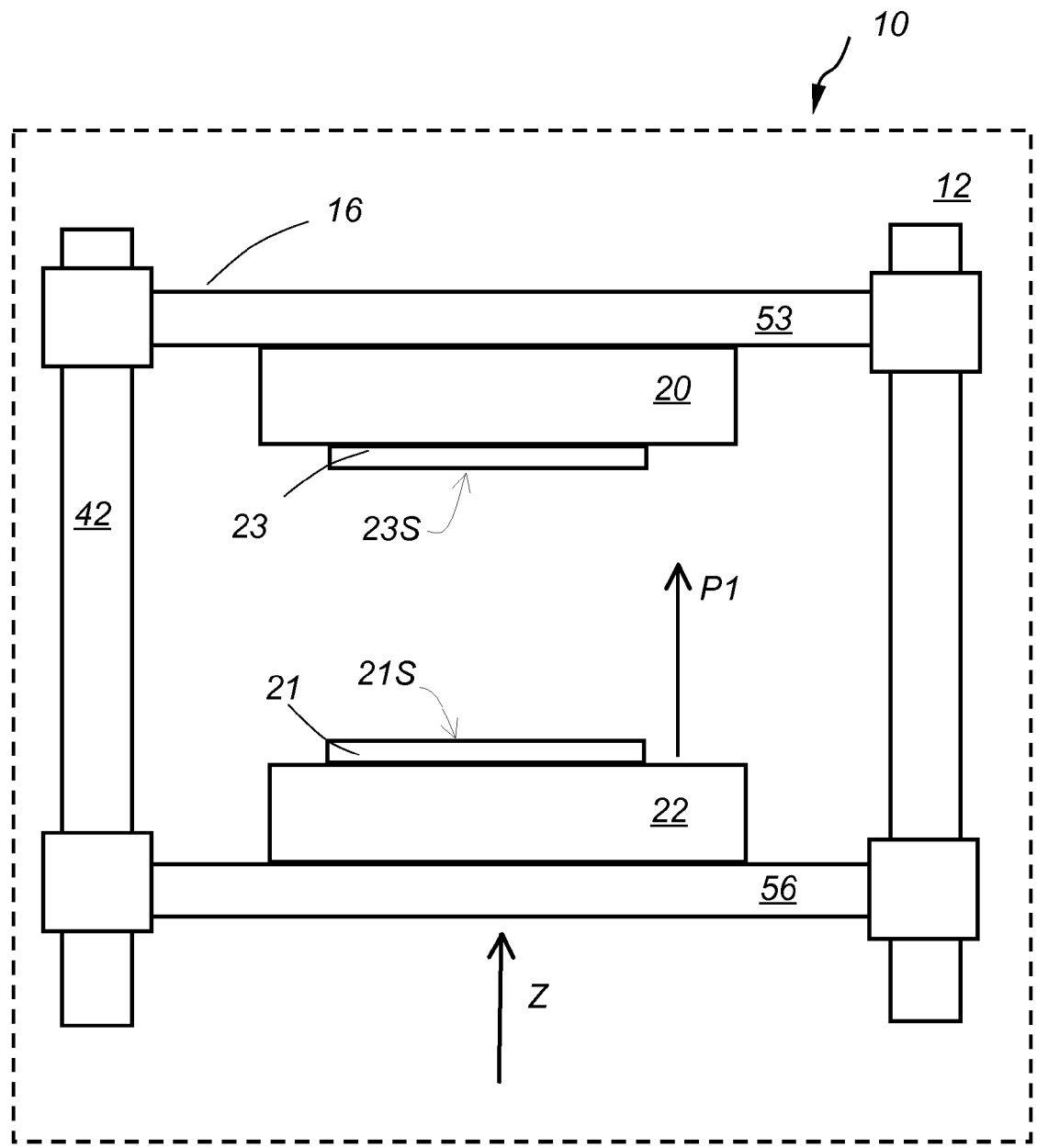
FIG. 6 is a schematic cross-sectional diagram of the wafer bonding apparatus.

Referring to FIG. 3, in a wafer bonding system 400 according to this invention, a first wafer 410 having a first surface 410a is brought into contact with a second wafer 420 having a first surface 420a, so that the two surfaces 410a, 420a are opposite to each other. The wafer bonding process involves compressing the two wafers together by applying a "force column" 450 on a second surface 410b of the first wafer 410. Force column 450 includes a plurality of forces arranged in a column having a base dimensioned to cover the entire second surface 410b of the first semiconductor wafer 410 and is configured to apply a uniform pressure to the entire second surface 410b of the first wafer 410 and to transfer a uniform pressure to the bond interface 405 of the wafer stack 302. In other embodiments a second force column 460 may be applied simultaneously with force column 450 on the second surface 420b of the second wafer 420, as shown in FIG. 5. In one example, force column 450 is a pressurized gas column and applies forces of the order of 90 KN on a 200 mm wafer, which generates a pressure of approximately 29000 mbars. Finite element analysis of the displacement and of the Von Mises stresses along the bond interface 405 are shown in FIG. 4A and FIG. 4B, respectively. We observe layers 401, 402 and 403 with uniform displacement and a uniform stress region 404 with no variations between the central 406 and periphery regions 407 of the bond interface 405. In some embodiments, surfaces 410a, 420a have bond layers 412, 422, respectively, configured to promote a specific type of bonding between the two wafer surfaces 410a, 420a. Bond layers 412, 422 may be grid structures, metal, glass, semiconductor structures, insulators, integrated devices, adhesives or any other bond promoting material or structure. The system is designed to perform any desirable substrate bond process including anodic, eutectic, adhesive, fusion, glass frit and thermocompression bond processes for wafer to wafer bonding. Accordingly, the system has suitably controls for controlling the bonding operation parameters including substrate temperature, bond pressure and chamber atmosphere, among others. In other embodiments, system 400 is used to bond any type of semiconductor structures or materials including flat panel structures, integrated circuit devices, 3D integration of microelectronics and packaging of Micro-Electro-Mechanical-Systems (MEMS), among others.

Figure 18:
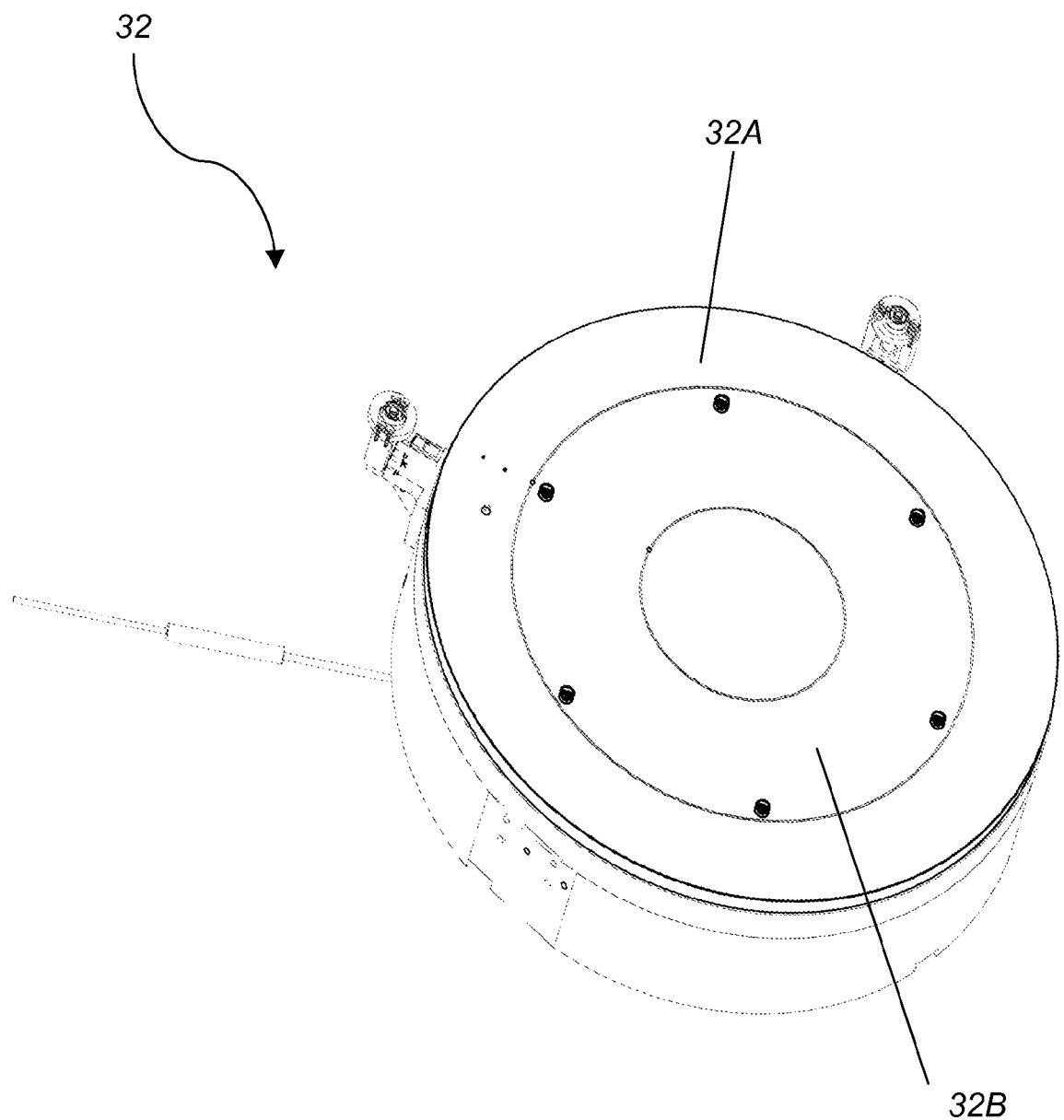
FIG. 18 is a schematic diagram of the wafer heater system.
Figure 19:
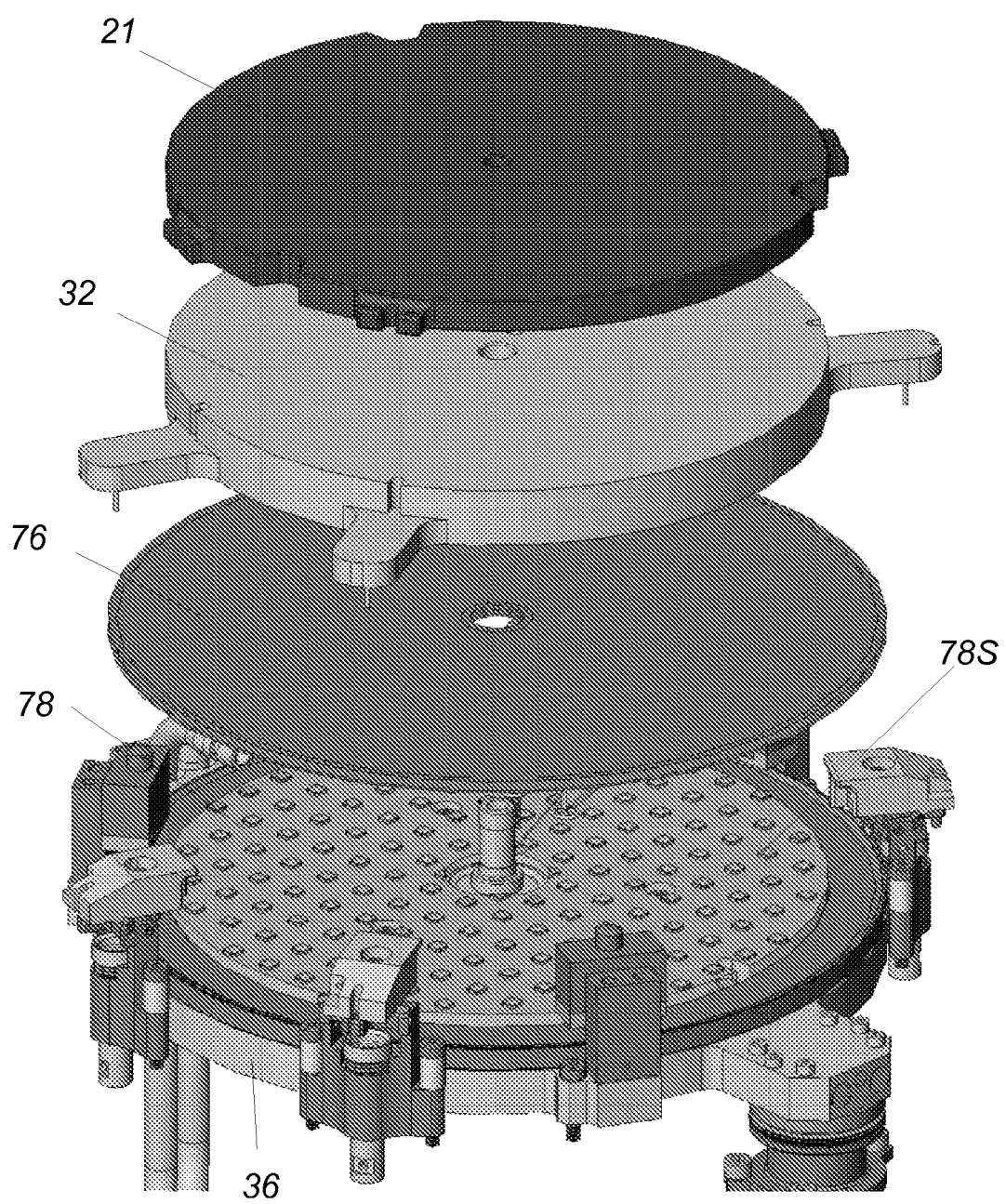
FIG. 19 is an exploded view of the wafer heater and thermal isolation systems.

Referring to FIG. 6-FIG. 14, bond apparatus 10, operates generally as a clamp. The apparatus 10 has opposing clamping blocks, in this embodiment an upper block assembly 20 and opposing lower block assembly 22. The lower block 22 assembly has a chuck 21 for holding one or more wafers thereon. One or more stacks 430 of one or more wafers 410, 420, shown in FIG. 3, are positioned on the wafer chuck 21 of the apparatus 10. Lower block assembly 22 is supported by the bottom plate 56 and upper block assembly is supported by the top plate 53. Bottom plate 56 and top plate 53 are movably connected to posts 42. In this embodiment, the lower block assembly 22 and the bottom plate 56 move upward along the Z-direction to bring the wafer(s)/stack(s) substantially to or near contact with bearing surfaces 23S of the upper block assembly 20. When this proximity position is reached, the positions of the bottom plate 56, top plate 53 and upper block assembly 20 are fixed and the lower block assembly 22 is moved upward along the direction of arrow P1 toward the upper block assembly 20 to apply a desired high bonding pressure on the wafer stack 430. In one example, the desired bonding pressure is 90 KN on a 200 mm wafer stack or a 100 KN of a 300 mm wafer stack. In alternate embodiments, the upper block 20 or both of the upper block 20 and the lower block 22 are moved together to apply the desired high bonding pressure on the wafer stack(s) 430, and effect bonding between the interfacing wafer surfaces 410a, 420a. The upper block assembly 20 and lower block assembly 22 deliver the high bonding pressure substantially uniformly (i.e. without significant pressure variance) across the area of the wafer bond interface 405 and without inducing substantially any shearing stress at the interface (e.g. substantially zero shearing stress at the bond interface of the wafers) as will be described in greater detail below. The load distribution within the upper block assembly 20 and lower block assembly 22, resulting in the aforementioned bonding pressure, is a substantially true column loading in respective load bearing members, substantially eliminating load eccentricities and bending moments causing flexure in the upper and lower block assemblies, as well as other portions of the apparatus. Loading uniformity and repeatability is provided by a structural skeleton 16 of the apparatus 10 that substantially bypasses the chamber housing 12 as load bearing member of the apparatus. Loading uniformity on the bond interface 405 is further established by the apparatus 10, with a leveling system 82 that maintains the wafer bearing surfaces 23S, 21S of the upper block 20 and lower block 22 assemblies, respectively, substantially level or parallel with each other, and ensures that bonding forces are applied by the lower block and upper block assemblies substantially normal to the bonding interface 405 of the wafer stack 430. As will also be described further below, the upper block 20 and lower block 22 assemblies in the exemplary embodiments include heaters 30, 32, respectively, (or thermal cyclers for the thermal cycling of the wafer contact surfaces 23S, 21S) that are thermally isolated from the apparatus structure by load bearing, vacuum isolation systems 70, 72, respectively. The load bearing, vacuum isolation systems 70, 72 provide optimal thermal isolation performance while eliminating undesired thermal leaks and reducing thermal mass (and hence inertia) of the thermally cycled portion (with commensurate fast cycles time performance), and nevertheless are capable of supporting desired loads (e.g. bonding pressure loads in the exemplary embodiment). In some embodiments, heaters 30, 32 may have more than one heating zones. Referring to FIG. 18, heater 32 includes a first heating zone 32B configured to heat the center region of the wafer and a second heating zone 32A configured to heat the periphery of the wafer. Heating zone 32A is controlled independently from heating zone 32B in order to achieve thermal uniformity throughout the entire bond interface 405 and to mitigate thermal losses at the edges of the wafer stack.

The apparatus 10 is capable of bonding wafers or substrates 410, 420 of any suitable type and size. For example, the substrates 410, 420 may be 100 mm, 200 mm, or 300 mm diameter semiconductor substrates. In the embodiment shown in FIG. 3, the wafers 410, 420 are substantially similar to each other. In alternate embodiments, the stack 430 may comprise different types or different size wafers. Stack 430 is shown in FIG. 3 as having two wafers 410, 420 for example purposes. As may be realized, stack 430 may include any desired number of wafers being bonded together. The bonded surfaces 410a, 410b may include bond layers 412 and 422, respectively and the bond layer 412, 422 may be metal, grid structures, semiconductor structures, insulators, adhesives or glass, among others.

Figure 7:
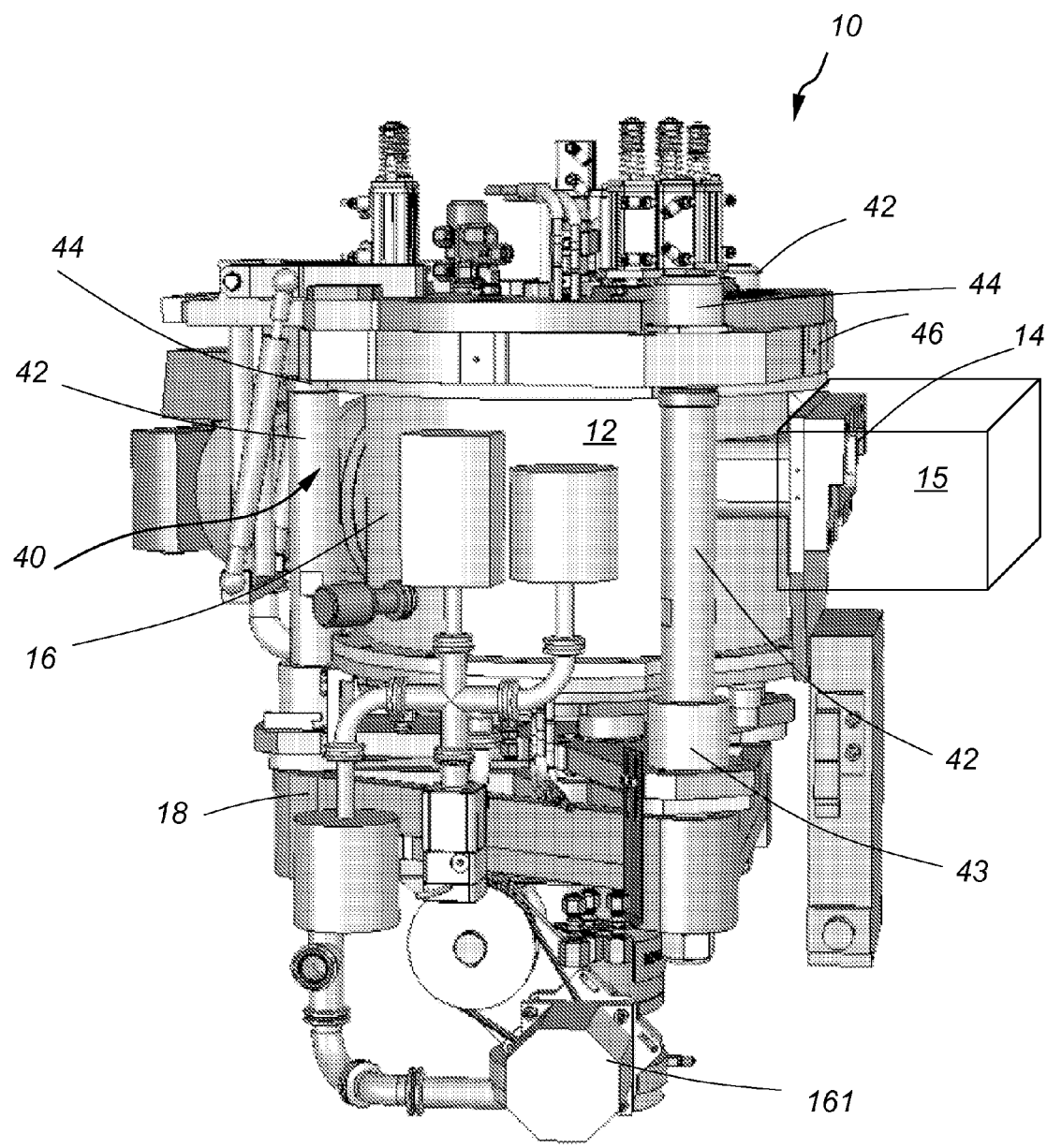
FIG. 7 is a perspective view of a wafer bonding apparatus according to this invention.
Figure 16:
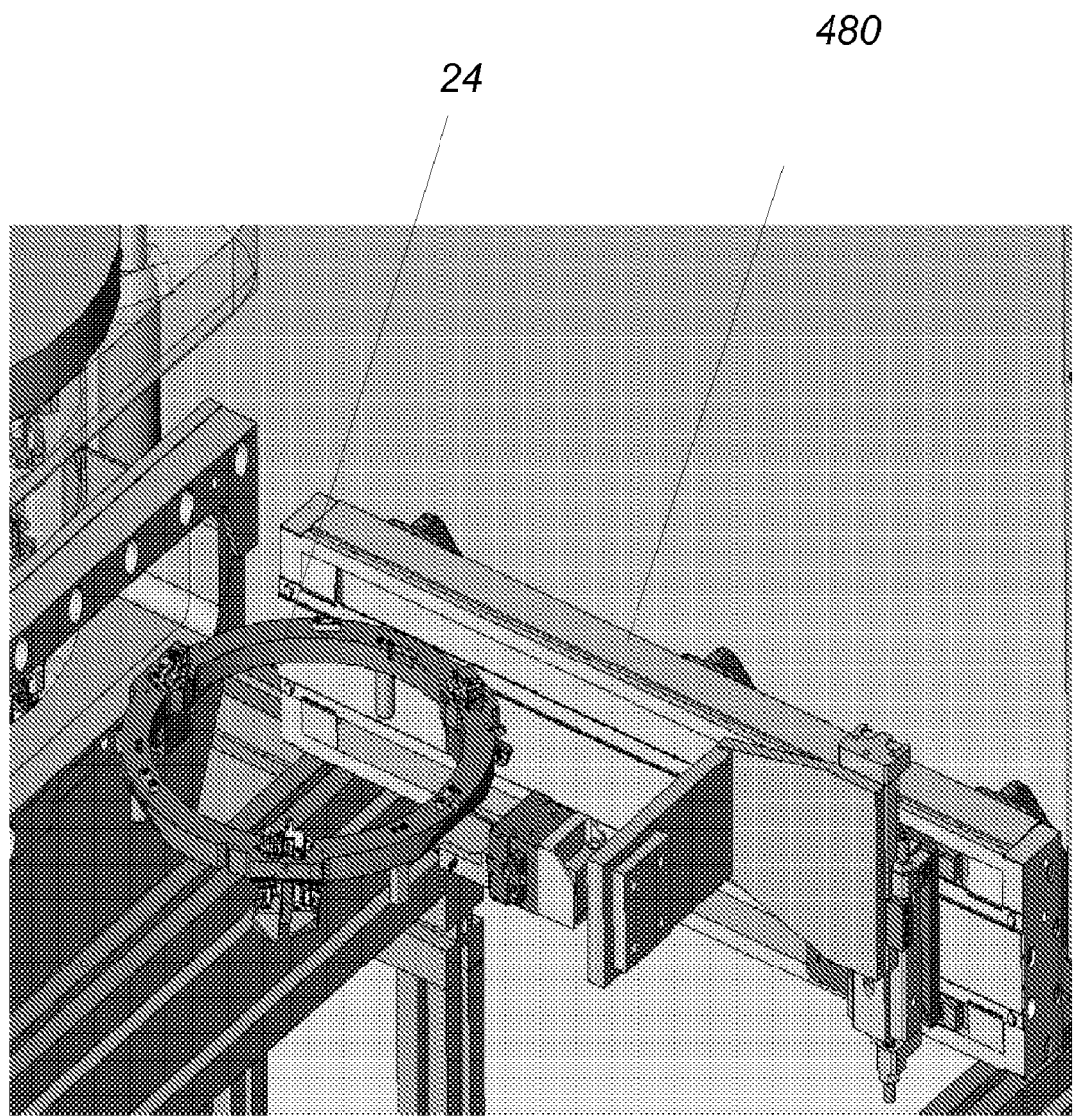
FIG. 16 is a perspective view of the wafer carrier fixture and the wafer loading system.
Figure 17A:
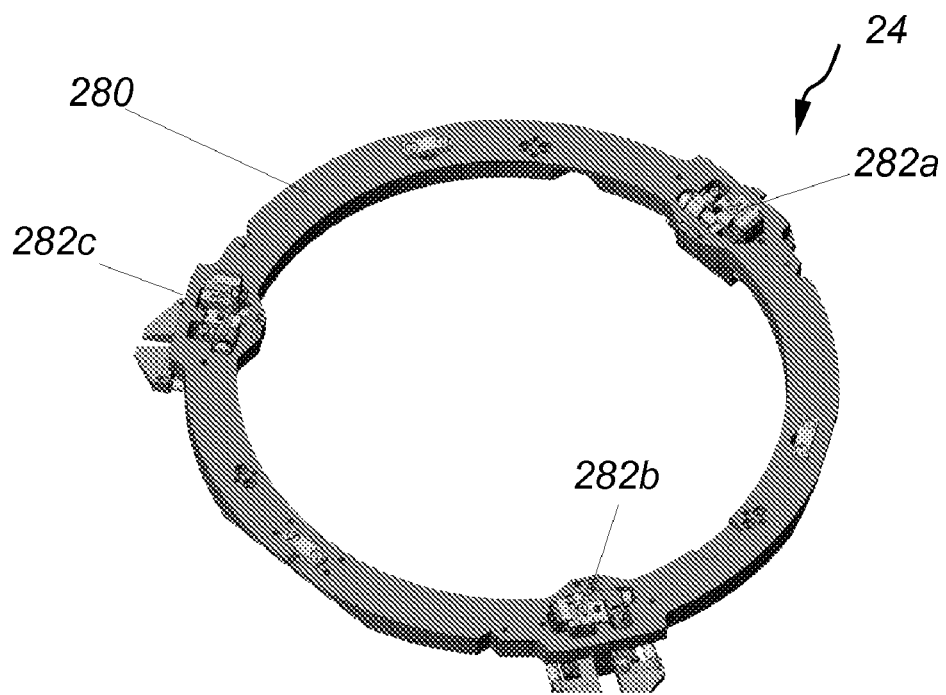
FIG. 17A is a top perspective view of the wafer carrier fixture.
Figure 17B:
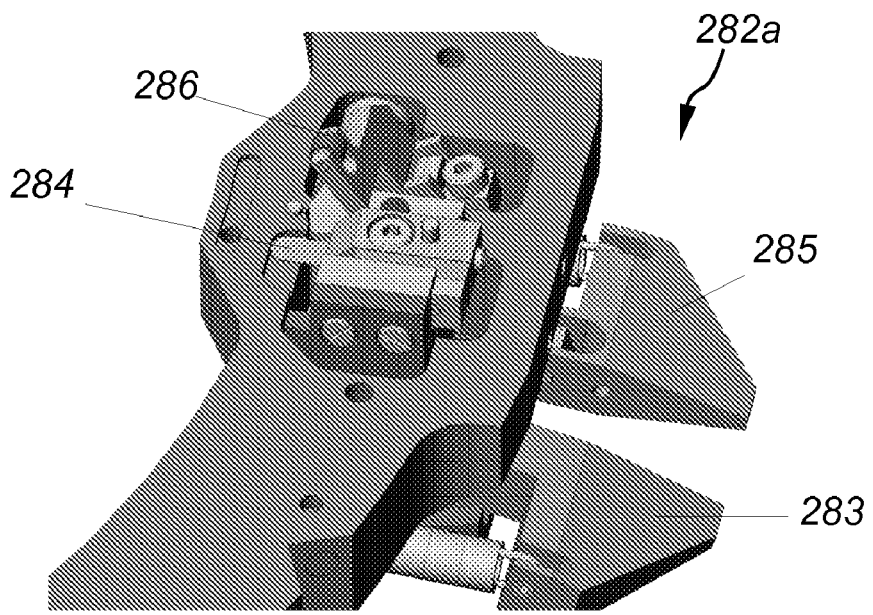
FIG. 17B is a detailed view of the wafer spacers and clamping system in the wafer carrier fixture of FIG. 17A.

Still referring to FIG. 6-FIG. 14, and in greater detail, bond apparatus 10 includes a chamber 12. The chamber 12 is closed or otherwise configured to have a controlled atmosphere, such as an inert gas, or is held in vacuum conditions with a turbo pump system 161, shown in FIG. 7. In alternate embodiments, the apparatus may not include a chamber. As seen in FIG. 7, the chamber 12 includes an access port 14. The access port 14 is sized to allow placement and removal of a carrier fixture 24 into the chamber 12, shown in FIG. 9. In some embodiments, a pre-load chamber 15 communicates with chamber 12 through port 14, as shown in FIG. 7. Port 14 has a door (not shown) for closing the port if desired. For loading the wafer stack into the evacuated chamber 12, first the port door is closed and the carrier fixture 24 with the pre-aligned wafers 410, 420 is placed in the pre-load chamber 15. Next, the pre-load chamber 15 is evacuated and then the port door is opened and the carrier fixture 24 with the pre-aligned wafers 410, 420 is placed in the chamber 12. The port door is then closed again. For the removal of the bonded wafers, the pre-load chamber 15 is evacuated and then the port door is opened and the carrier fixture 24 with the bonded wafers 410, 420 are removed from the chamber 12 and the port door is closed again. Carrier fixture 24 holds the previously aligned wafer stack 430. A transport device 480, such as a transport arm or slide, that is automated or otherwise manually operated, is used to move the carrier fixture 24, into and out of the chamber 12, as shown in FIG. 16. In one embodiment, shown in FIG. 17A, carrier fixture 24 is a circular shaped ring 280 and includes three spacer and clamp assemblies 282a, 282b, 282c arranged symmetrically at the periphery of the circular ring at 120 degrees apart. Each spacer and clamp assembly 282a, 282b, 282c includes a spacer 284 and a clamp 286. Spacer 284 is configured to set the first and second wafers 410, 420, at a predetermined distance. Spacers with different thicknesses may be selected for setting different spacings between the two wafers. Once the spacers are inserted between the wafers the clamp is clamped down to lock the position of the two wafers. Each spacer 284 and each clamp 286 are independently activated by linear actuators 283 and 285, respectively. For the bonding process the aligned wafers 410, 420 are placed in the carrier fixture 24 and are spaced apart with spacers 284 and then clamped down with clamps 286. The fixture with the clamped wafers is inserted in the bonding chamber 12 and then each clamp is unclamped one at a time, the spacer is removed and then clamped again. Once all spacers are removed the wafers are clamped again, and the two wafers are staked together with a pneumatically controlled center pin 290 and then the force column 460 is applied to facilitate the bonding process. The wafers are staked together with a force that is automatically or manually adjustable.

Figure 8:
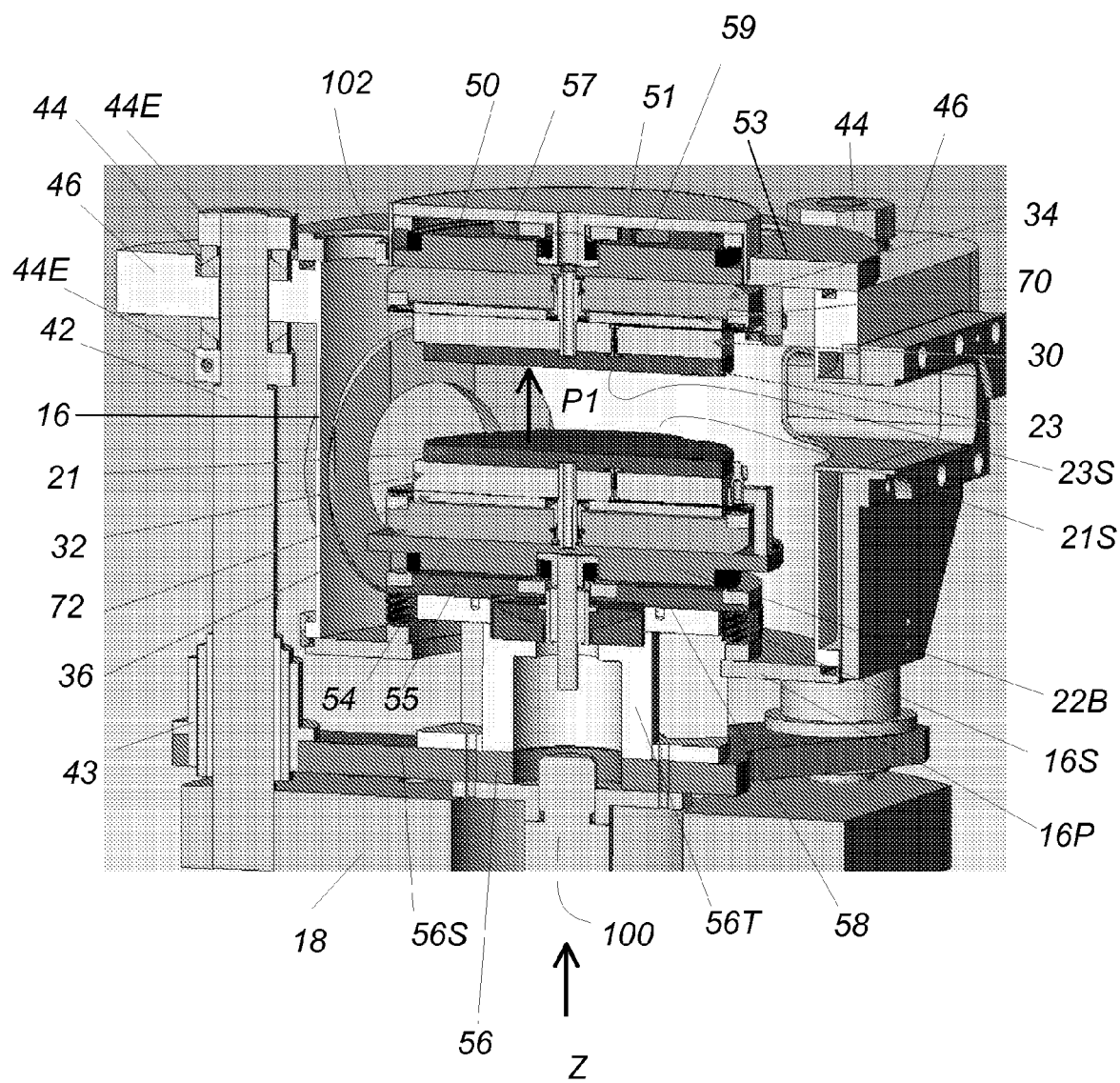
FIG. 8 is a cross-sectional view of the wafer bonding apparatus of FIG. 7.

As shown in FIG. 8, at least one of the upper block 20 and/or the lower block 22 are movably held in the chamber 12. In the embodiment shown in FIG. 8, the upper block 20 and opposing lower block 22 are depicted in a vertical clamping configuration. In alternate embodiments, the opposing upper block 20 and lower block 22 are arranged in any other desired clamping orientation including horizontal clamping configuration. In the exemplary embodiment, the upper block assembly 20 is fixed and the lower block assembly 22 is movable along the direction indicated by arrow P1, shown in FIG. 6. The lower block assembly 22 is also moved as a unit together with the bottom support plate 56 along the Z-direction (shown in FIG. 6) by a suitable drive 100, referred hereto as a z-drive.

In the exemplary embodiment, the lower block 22 has a movable portion 22M, capable of being moved in the direction indicated by arrow P1, independent of the z-drive 100, by a suitable actuator 52 as will be described below. In the exemplary embodiments, z-drive 100 provides gross motion to the lower block assembly 22 together with support plate 56, and actuator 52 moves the movable portion 22M of the lower block 22 assembly for bonding. In alternate embodiments, the z-drive 100 moves the upper block assembly 20 downward in direction opposite to the indicated Z-direction. The upper block 20 and lower block 22 have corresponding seating surfaces 23S, 21S. The upper and lower block assemblies 20, 22 and seating surfaces 23S, 21S are sized as desired to generate suitable bonding pressure on the wafer stack. As noted before, and will be described below the seating surfaces 23S, 21S have heat control (i.e. are capable of being heated and/or cooled). The heat control is provided by any suitable thermal controller. In one example, seating surfaces 21S, 23S are made from a suitably hard material such as SiC.

Referring now also to FIG. 7 and FIG. 8, the chamber 12 generally comprises a casing or shell 16 that is substantially closed to allow isolation of the chamber interior from outside. In the exemplary embodiment shown, the casing 16 is generally annular though in alternate embodiments the casing may have any desired shape. The chamber casing 16 is supported from a desired base or foundation structure 18 by a skeletal or support frame 40. The base structure 18 is of any desired type and shape, and is shown as a substantially flat plate 18 located below the chamber 12 for example purposes. The base structure 18 is substantially rigid, and in alternate embodiments may have any desired size, shape and location relative to the chamber. The skeletal frame 40 of the apparatus 10 has substantially rigid members that are attached to the casing 16 and joined to the base structure 18 to carry the casing 16. The skeletal structure 40 is also attached to the upper block and lower block assemblies 20, 22 of the apparatus 10 so that reaction on the upper block and lower block assemblies 20, 22 during the application of the bonding forces is distributed to the skeletal frame 40 and not the chamber casing 16. In the exemplary embodiment, the skeletal frame 40 is substantially an exoskeletal frame located outside the chamber 16. In alternate embodiments the skeletal frame 40 may be an endoskeletal frame located within the chamber if desired. In the exemplary embodiment, the skeletal frame 40 comprises substantially rigid post 42 (three are shown for example purposes, though any desired number may be used). Posts 42 are anchored at one end to the base structure 18. The posts 42 are distributed substantially equally around the casing 16. Size and shape of the posts 42 is selected as desired for desired rigidity. The skeletal frame 40 may also include a top attachment plate 46. As seen best in FIG. 7, the attachment plate 46 is attached to the casing 16 by any desired attachment means, such as welding, brazing, or mechanical fasteners. In alternate embodiments, the casing 16 and attachment plate 46 may be formed as a unitary member. The attachment plate 46, is a substantially rigid member. The stiffness of the plate 46, at least in response to reaction loads imparted thereon by the bonding press, is generally commensurate with the stiffness of the rest of the skeletal frame 40 including posts 42. In alternate embodiments, the attachment plate 46, attaching the casing 16 and other bonding press components inside the chamber 12 to the skeletal frame may have any other desired shape. As seen best in FIG. 8, the posts 42 are attached at another end to the attachment plate 46. The connection 44 between each post 42 and attachment plate 46 may be bi-directional, capable of supporting axial loads, along the axis of posts 42, both towards and away from the base plate 18.

The connection 44 of each post is adjustable (both up and down along the axis of the posts) to ensure substantially uniform loading of each post 42 under both static loads from the chamber and apparatus components, and static and dynamic loads during bonding press. In the exemplary embodiment, the connection 44 is generally symmetrical on opposite sides of the interface with the attachment plate 46. The connection 44 may include engagement members 44E (for example threaded arms), that engage the post 42 (e.g. by positive engagement surface or clamping) and have bearing surface for bearing loads from the attachment plate. The connection 44 may include bearing elements to ensure uniform load distribution from the attachment plate onto the bearing surfaces of the engagement members 44E. In alternate embodiments, the connection between the posts 42 of the skeletal frame 40 and attachment plate 46 carrying the chamber casing and bonding press may have any suitable configuration. In the exemplary embodiment the connection 44 may be preloaded (e.g. by torquing engagement members 44E) in order to eliminate undesired displacements of the posts 42 during bonding operation.

As seen best in FIG. 8, and as noted before, in the exemplary embodiment the upper block assembly 20 and the lower block assembly 22 are attached to the skeletal frame 40. The upper block assembly 20 is attached to skeletal frame 40 by a span support structure 53 as will be described further below. The static and dynamic loads, including bonding press loads, from the upper block assembly 20 are carried substantially entirely by the span structure 53 and distributed by the span structure 53 via attachment plate 46 to the posts 42. The lower block assembly 22 is attached to the posts 42 via a seat structure 56. In the exemplary embodiment shown, seat structure 56 generally has a span 56S and a block support seat 56T. In alternate embodiments, the seat structure supporting the lower block may have any other desired configuration. In the exemplary embodiment, the span structure 56S, shown as a plate for example, but may have any other desired form, is attached to the posts 42 by linear slides 43. Thus, in the exemplary embodiment the seat structure 56, and hence the lower block assembly 22, is capable of movement in the direction indicated by arrow z (z-direction). The posts 42, may serve as guides for z movement of the lower block. In the exemplary embodiment shown in FIG. 8, the z-drive 100, which may be any suitable drive (e.g. electric linear drive, pneumatic, hydraulic drive etc.), is connected to the span structure 56S and is capable of moving the seat structure 56 and lower block assembly 22 in the z direction as a unit. The z-drive 100 may be attached to the base structure 18. As seen in FIG. 8, the support seat 56T is connected to the lower block assembly 22. In the exemplary embodiment, the support seat 56T extends generally into the casing 16. A bellows seal 16S, between the casing 16 (in the example shown attached to a closure plate 16P of the casing) and the support seat 56T, isolates the chamber interior, and accommodates the z-motion of the seat structure 56 and lower block assembly 22. The seat structure 56 shown in FIG. 8 is merely exemplary, and in alternate embodiments the structure may have any desired configuration. In the exemplary embodiment, the seat structure 56 has a seat surface 58 that engages the bottom of the lower block assembly 22.

Figure 13:
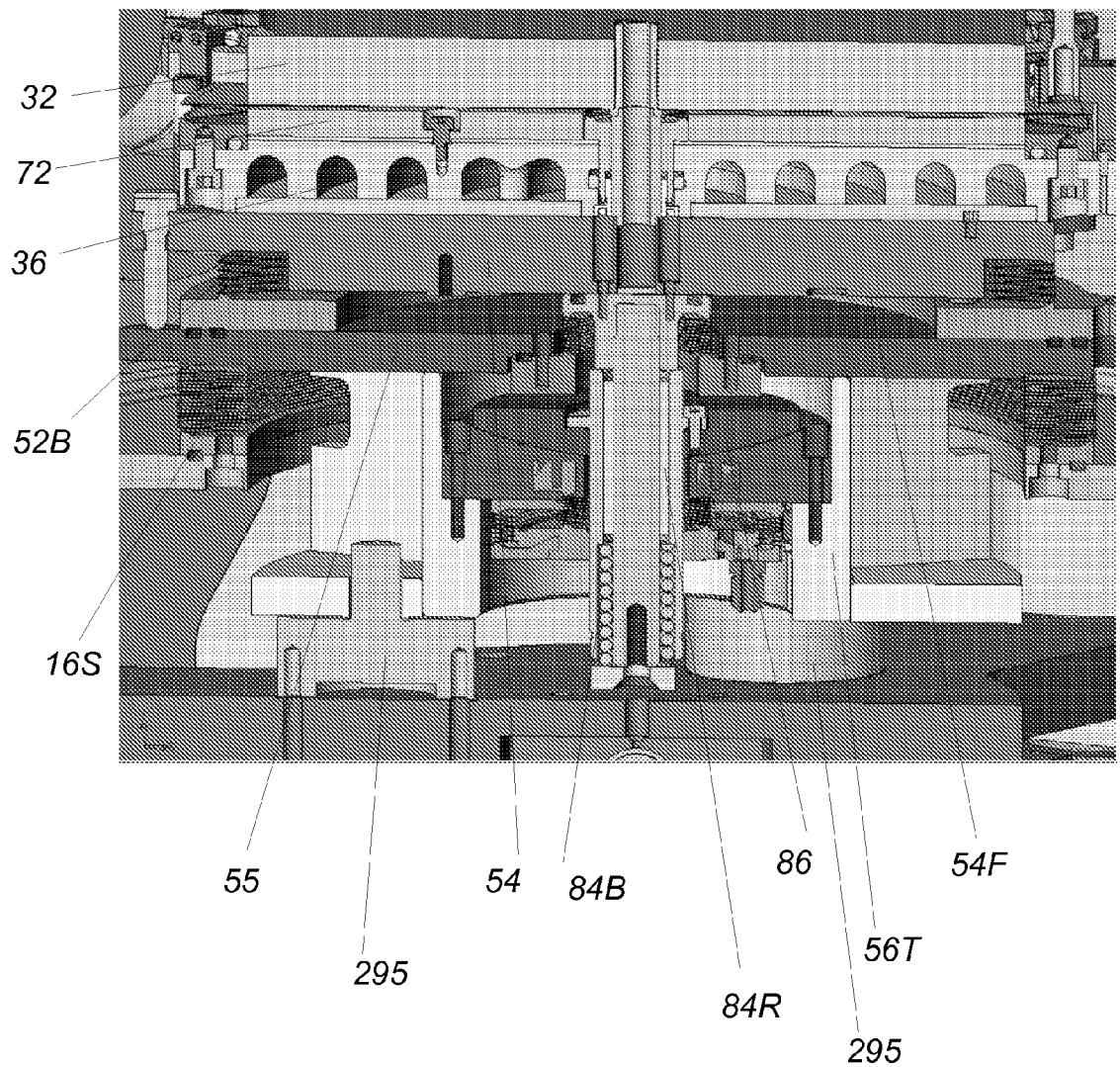
FIG. 13 is a detailed cross-sectional view of one embodiment of the alignment system in the wafer bonding apparatus of FIG. 8.

As seen best in FIG. 8, the lower block assembly generally includes a chuck 21, with wafer support surface 21S, a heater (or thermal cycler) 32 and flange 36. The heater 32 is supported by flange 36. The heater 32 is thermally isolated from the flange 36 by a load bearing, vacuum isolation system 72 described further below. The flange 36 is maintained at a desired steady state temperature by a thermal regulator (e.g. a water cooling system). The chuck 21 is connected to the heater 32 so that the wafer support surface 21S, and hence the wafer seated thereon, is heated by the heater 32. The chuck 21, heater 32 and flange 36 form the movable section 22M of the block assembly 22. Movable section 22M is movable in direction P1 relative to a base section 22B of the block assembly 22, shown in FIG. 9. In the exemplary embodiment, the block assembly 22 includes an actuator 52 that actuates the movable portion 22M, independent of the z-drive motion, and generates a force column substantially uniformly distributed across the seating surface 21S of the block assembly 22. In the exemplary embodiment, the actuator 52 is driven by a pressurized gas, though in alternate embodiments, the actuator may be driven by hydraulic or magnetic means capable of generating a substantially uniformly distributed force column across the wafer seating surface. In the exemplary embodiment shown in FIG. 8, the actuator 52 has a movable plate member 54, and a base or reaction member 55. In this embodiment, the base member 55 is fixedly seated against surface 58 of seat structure 56. Below seals 52B join the plate 54 and base members 55 of the actuator 52, and isolate the actuator from the chamber interior, as shown in FIG. 13. As may be realized, a desired gas (e.g. clean air or inert gas, N2) is introduces between plate 54 and base members 55 for actuation. The pressure of the gas is controlled to achieve the desired high pressures (e.g. about 90 KN on 200 mm wafers, or about 100 KN on 300 mm wafers) for bonding the wafer stack. The plate member 54 in the exemplary embodiment has a pressure face surface 54F that is substantially similar (e.g. shape, size) and aligned parallel to the wafer support surface 21S of the chuck 21 so as to provide a substantially uniform column for loading between plate face 54F and wafer support surface that is substantially normal to the plane of the wafer support surface. The bonding pressure is monitored with the pressure gauges 295, shown in FIG. 13. In some embodiments, the size of the pressure face surface 54F is adjusted via a manual or an automated mechanism in order to accommodate different size wafers. As may be realized, orthogonality of the loading by the actuator on the wafer support surface may be readily achieved by controlling planarity and parallelity of the plate pressure face and wafer support surface.

Figure 9A:
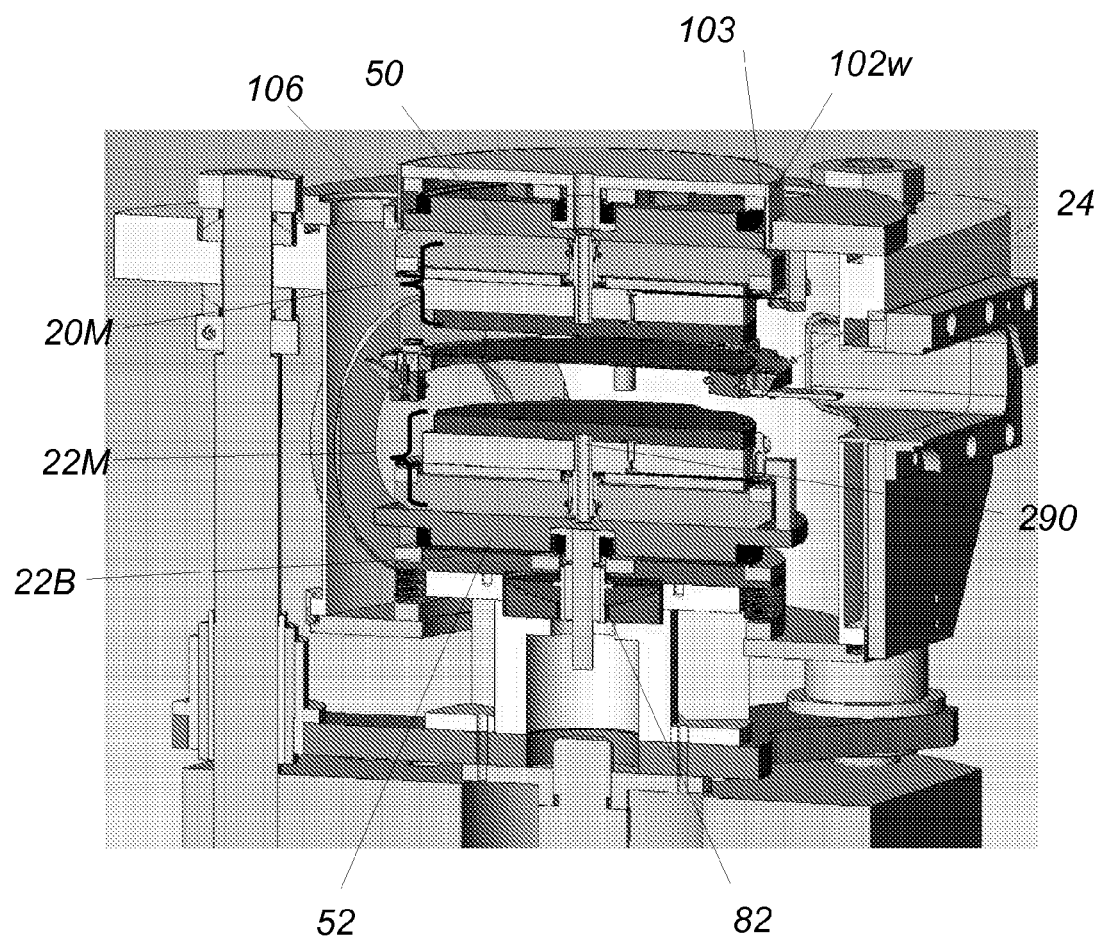
FIG. 9A is a cross-sectional view of the wafer bonding apparatus of FIG. 8 including a wafer transport fixture.
Figure 9B:
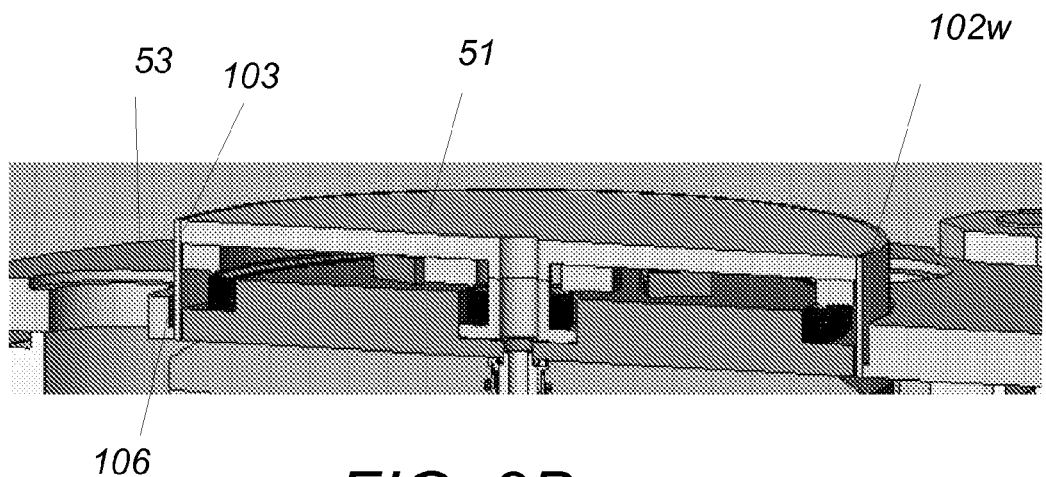
FIG. 9B is a detailed cross-sectional view of a portion of the upper block assembly of FIG. 9A.
Figure 10:
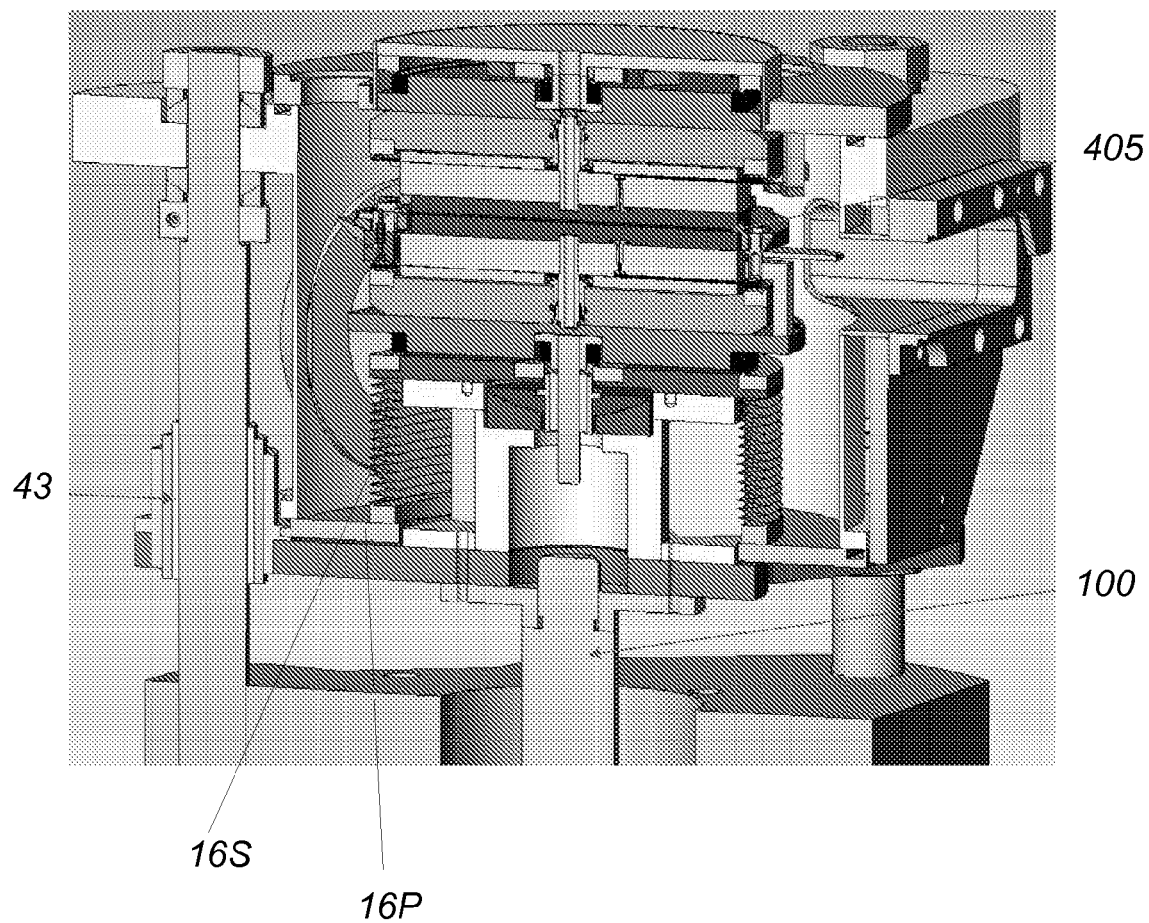
FIG. 10 is a cross-sectional view of the wafer bonding apparatus of FIG. 9 with the wafers being in contact with the top and bottom block assemblies (proximity position)
Figure 11:
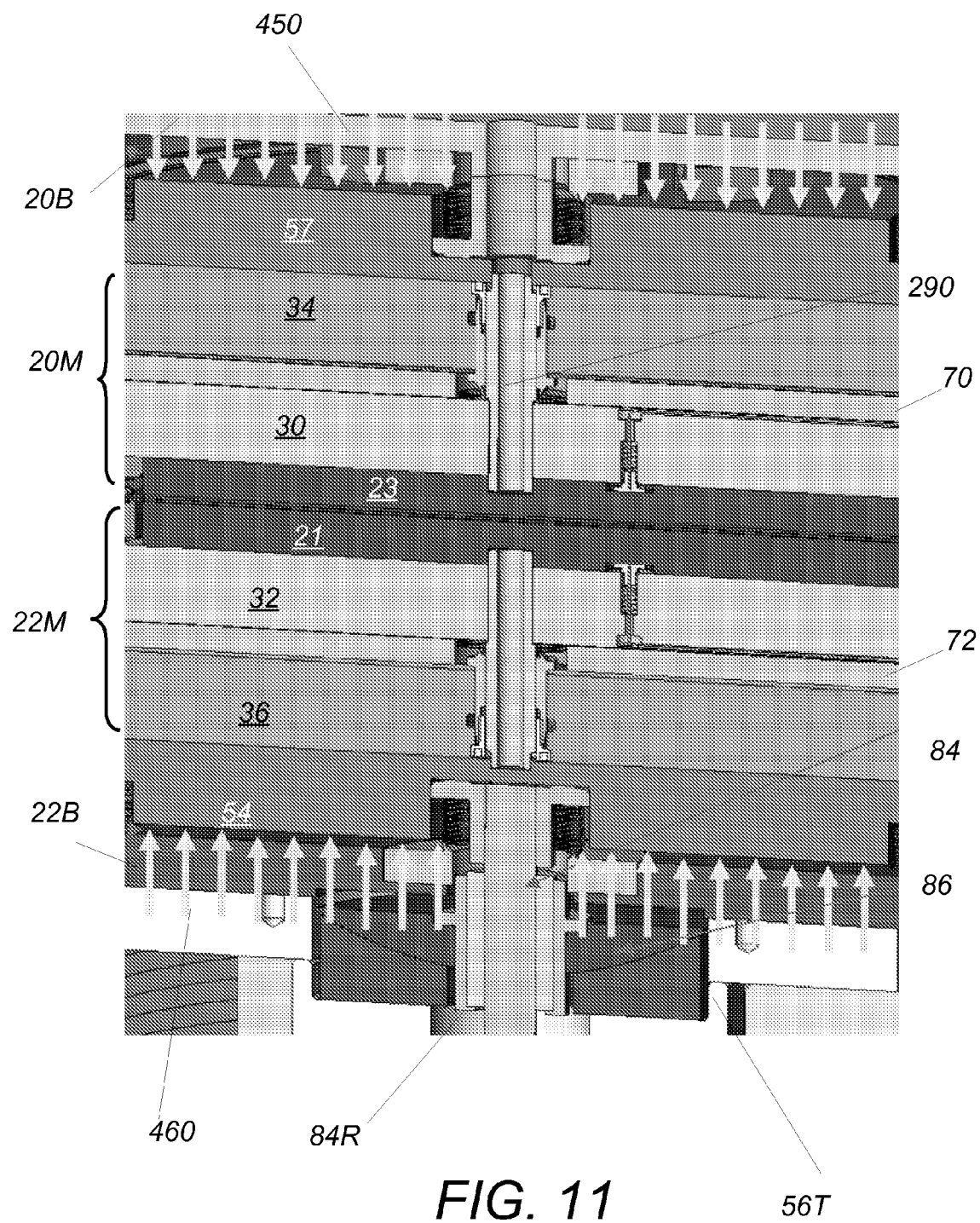
FIG. 11 is a detailed cross-sectional view of the wafer bonding apparatus of FIG. 10.
Figure 12:
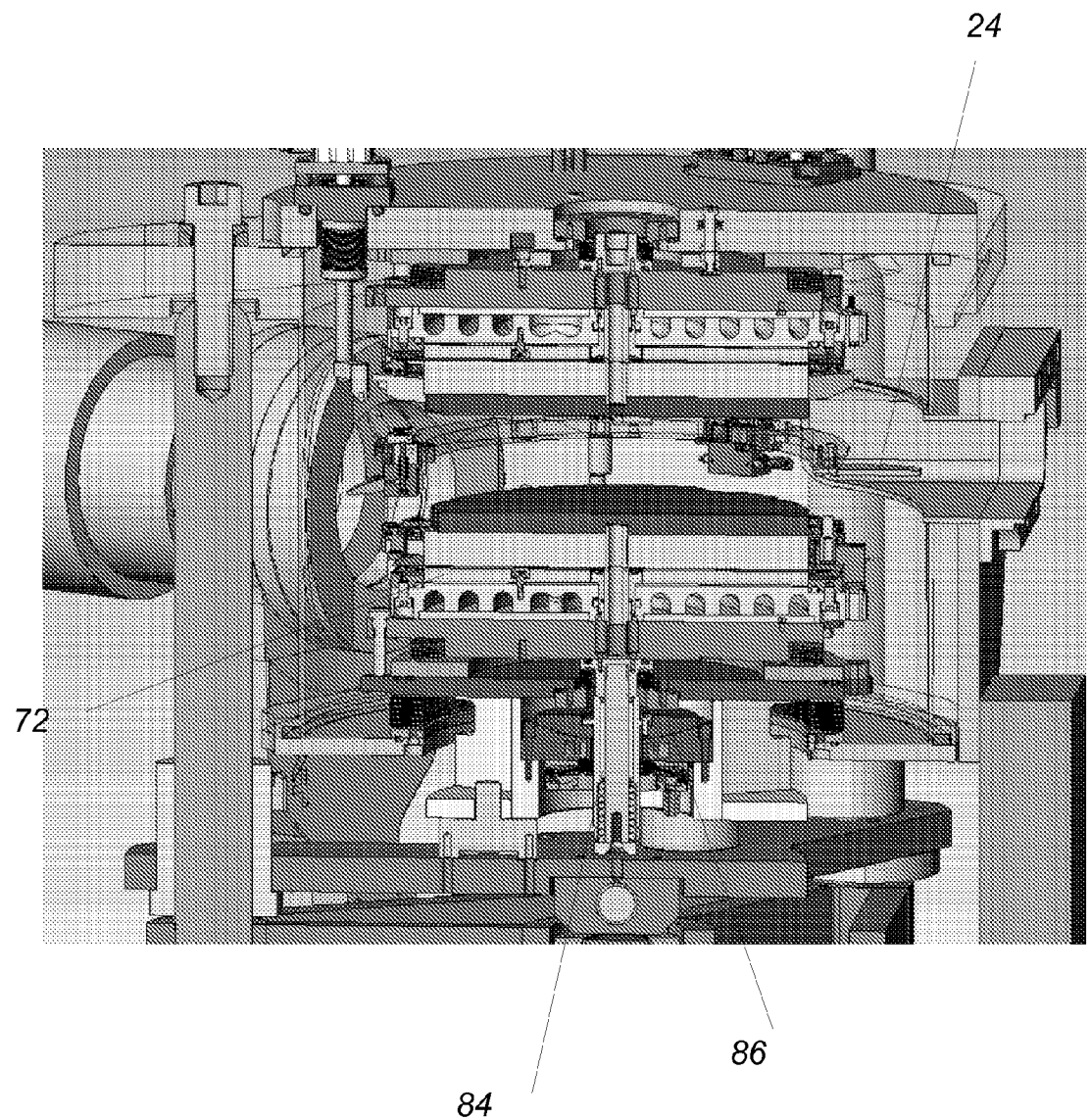
FIG. 12 is a cross-sectional view of the wafer bonding apparatus of FIG. 8 including cross-sectional views of the top and bottom assemblies.

As seen in FIG. 9, the lower block 22 in the exemplary embodiment also includes a leveling system 82 for leveling the wafer support surface 21S of the lower block assembly 22 with the wafer seating surface 23S of the upper block assembly 20. In the exemplary embodiment, the plate member 54, and hence the movable section 22M of the lower block assembly 22, rides on a layer of gas with respect to the base 55, and is positionally decoupled from the base 55 except as controlled by the leveling system 82. In the exemplary embodiment, the leveling system 82 includes a linear guide portion 84 and a rotational guide or gimbal portion 86, shown in FIG. 12. The linear guide portion 84 guides the movement of the movable block section 22M so that the wafer support surface 21S travel is substantially axial in the direction indicated by arrow P1 (without any lateral translation). The rotational guide portion 86 guides the movement of the movable portion 22M so that the wafer support surface 21S may rotate and/or tilt around a center point 85 (shown in FIG. 10) corresponding to the center of the wafer bond interface 405 without translation. The leveling system 82 may be autonomous/automatic or may be manually operated if desired. In the exemplary embodiment, the linear guide portion 84 includes a guide rod 84R that is movably supported in a linear bearing assembly 84B, shown in FIG. 13. The guide rod 84R is connected to the plate member 54 as shown in FIG. 13. In alternate embodiments, the linear guide portion 84 may have any other desired configuration. As seen in FIG. 13, in the exemplary embodiment, the linear bearing assembly 84B is mated to gimbal 86 defined by a hemispherical bearing assembly. The hemispherical bearing surface radius extends from the bond interface center 85. The gimbal 86 may be attached to the support seat 56T. In alternate embodiments, the gimbal portion may have any other desired configuration. In still other alternate embodiments, the linear guide and gimbal portions may be mated in any other desired arrangement. As seen in FIG. 13, the leveling system 82 is positioned so that the linear guide portion 84 and gimbal portion 86 are not loaded by the actuator 52 or any other portion of the lower block assembly during bonding operations. In the exemplary embodiment, the gimbal portion 86 is preloaded in order to lock and unlock the bearing surface. Preload may be accomplished by any desired preload system type, for example pneumatic or hydraulic pressure, mechanical or electromechanical pressure applied against the bearing surface. The preload system may be controllable with a suitable controller (not shown) or may be set to a desired lock limit. The leveling system 82 enables dynamically leveling of the lower block assembly to the upper block assembly. This eliminates the over-constrained condition that occurs when the top and bottom assemblies are not parallel, or if the wafer stack is wedged shaped. The bearing itself does not bear the bond load, and the center of rotation is at the wafer plane so that any rotation that occurs will not impart wafer shift.

Figure 20:
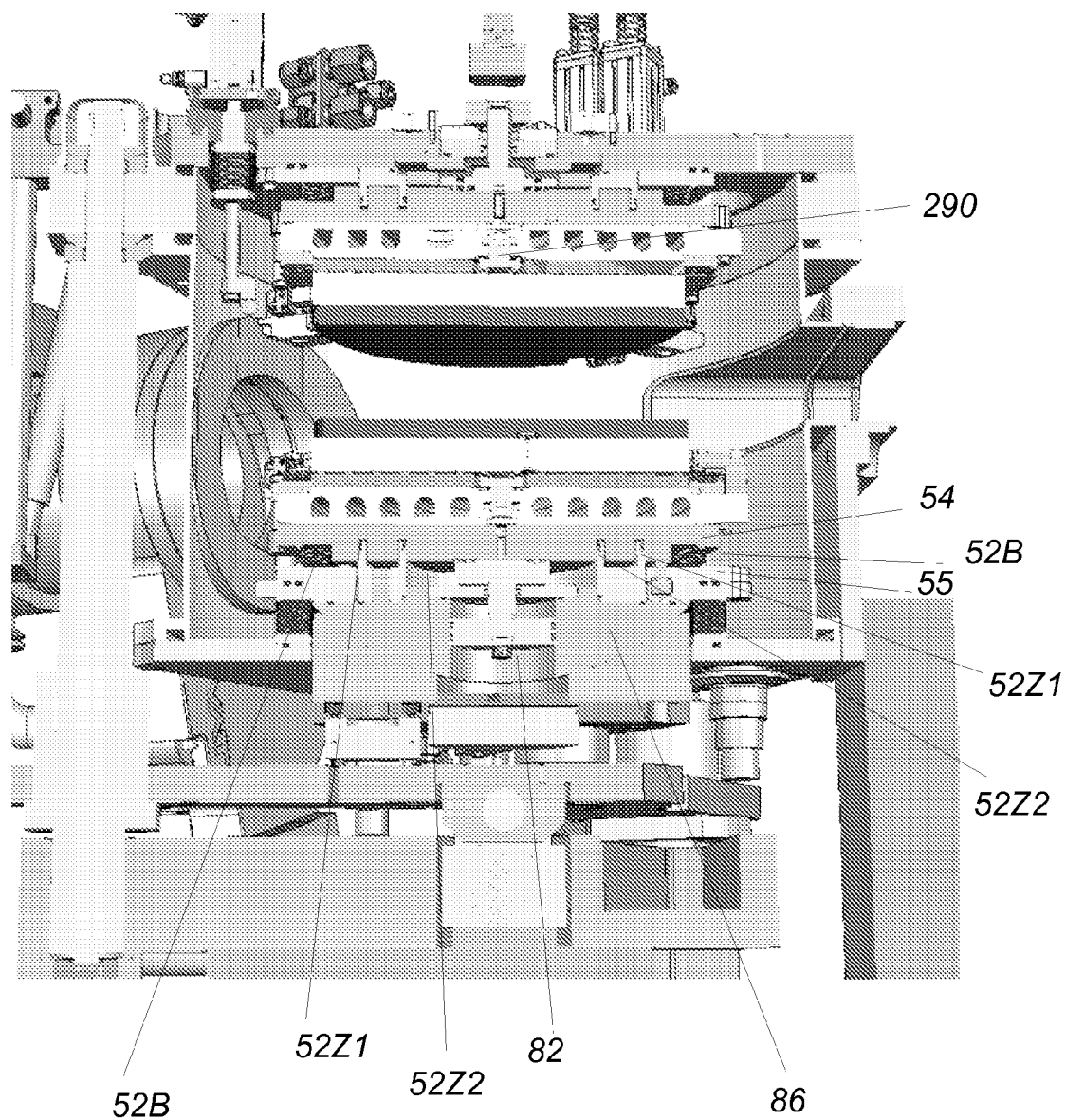
FIG. 20 is a cross-sectional view of another embodiment of the wafer bonding system.

Referring to FIG. 20, in another embodiment, the leveling system 82 is positioned so as to carry the load of the actuator 52 and bears the bond load. The gimbal portion 86 is positioned below the fixed plate 55 and supports the fixed plate 55, the movable plate 54 and the above lying flange 36, thermal isolation system 72, heater 32, chuck 21 and wafers (not shown). In this embodiment the size of the base of the applied force column is adjusted to accommodate wafers of various sizes. Fixed plate 55 is sealed against the movable plate 54 at the edges with bellows seal 52B and at selectable intermediary locations with piston or zone seals 52Z1 and 52Z2. The sealing locations of bellow seals 52B and intermediary zone seals 52Z1, 52Z2 are selected based on the size of the wafer stack that needs to be bonded and determine the base area of the applied force column. Pressurized gas fills the sealed region between the selected seals. In one example, the location of bellows seals 52B at the edges is selected for bonding 8 inch wafers, zone seal 52Z1 for bonding 6 inch wafers and zone seal 52Z2 for bonding 4 inch wafers.

Figure 14A:
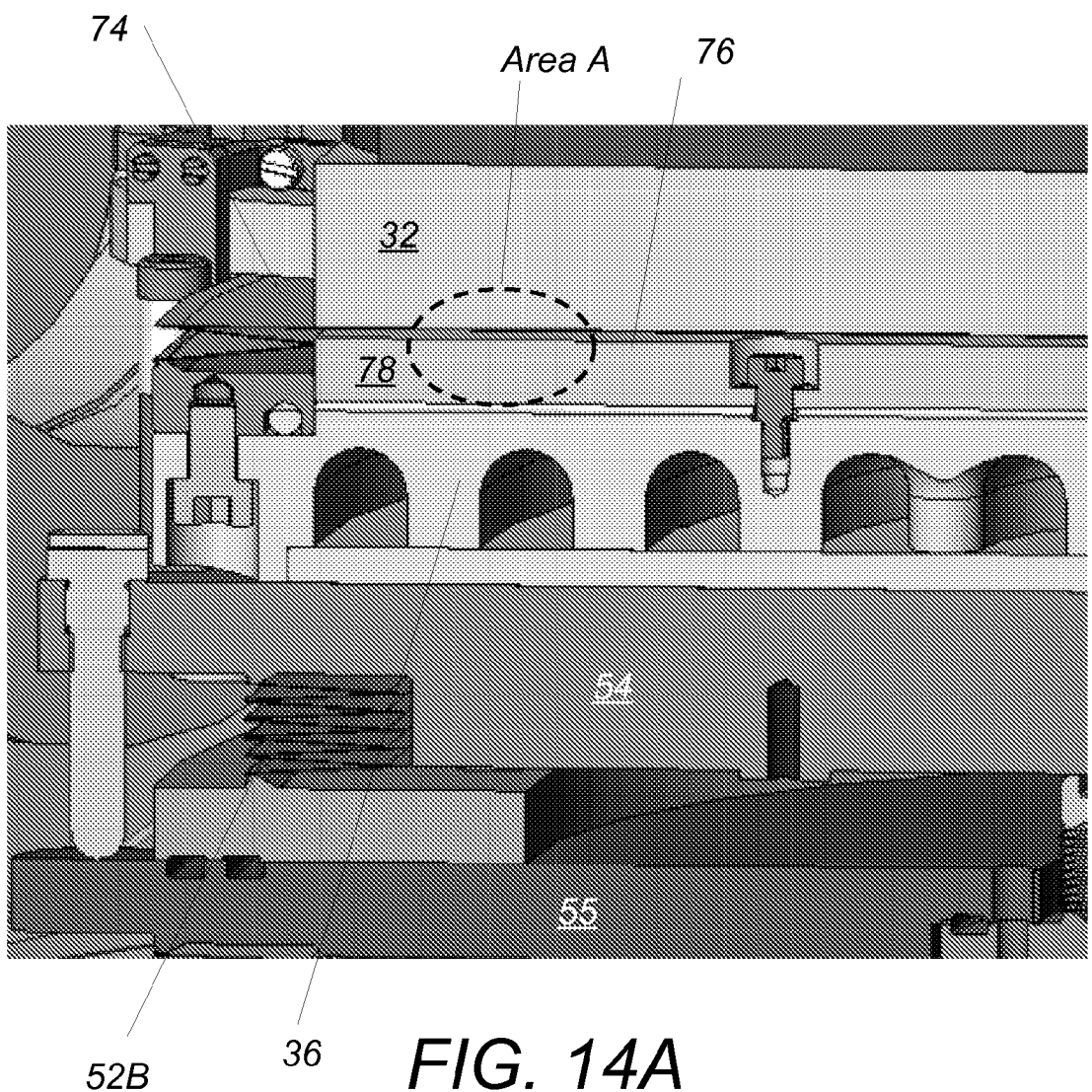
FIG. 14A is a detailed cross-sectional view of the thermal isolation layer in the bonding apparatus of FIG. 8.
Figure 14B:
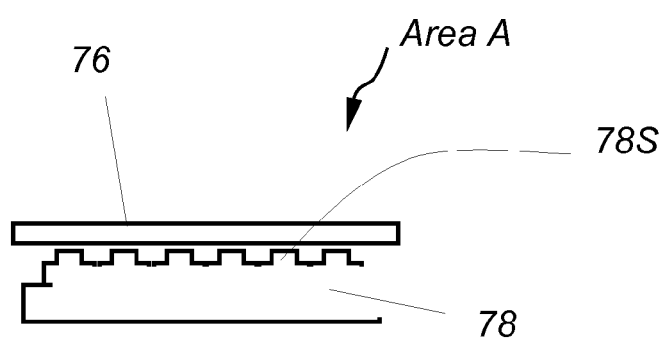
FIG. 14B is a schematic cross-sectional diagram of area A of FIG. 14A.
Figure 15:
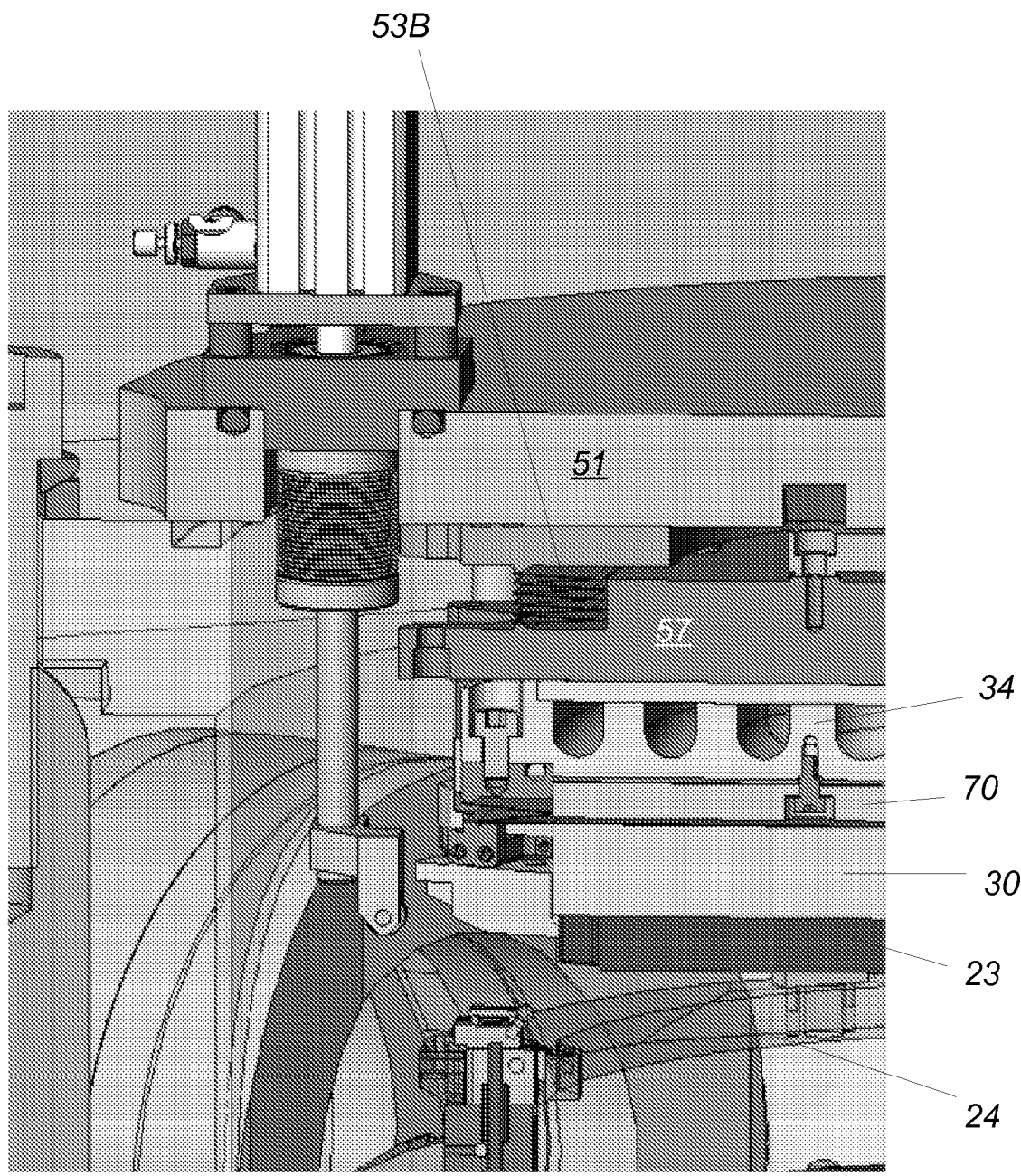
FIG. 15 is a detailed cross-sectional view of a portion of the upper block assembly of FIG. 8.

Referring now also to FIG. 14, as noted before, the lower block assembly has a thermal isolation system 72, thermally isolating the heater 32 from the mating portion of the block assembly supporting the heater. As also noted before, in the exemplary embodiment the thermal isolation system is a load bearing vacuum isolation system. As seen in FIG. 13, the isolation system 72 is positioned across the loading path from the actuator 52 to the wafer support surface 21S. Hence, the thermal isolation system 72 supports the bonding pressure loads. As seen in FIG. 14, the system 72 generally comprises a load-bearing vacuum layer confined between a plate 78 and a diaphragm 76. Diaphragm 76 is connected to plate 78 via bellows 74 outside of the load bearing region. The diaphragm 76 may be made of any suitable material such as Inconel™, and may be connected in any suitable manner, for example, by welding, to the open end of the bellows 74. As seen in FIG. 14, the bellows 74 are located outside the load bearing portion of the block assembly, and the diaphragm 76 is positioned in the load bearing portion. The diaphragm 76 is supported by plate 78 which comprises material having a low coefficient of thermal expansion (CTE). In one example, plate 78 is made of "Zerodur" ™, a glass ceramic manufactured by Schott AG. Plate 78 has a surface 78S formed to minimize the contact area with the diaphragm 76 yet has sufficient strength to bear the compressive loads during bonding, shown in FIG. 15. This structure 72 is continually evacuated to minimize heat transfer. As noted above, surface 78S is formed, for example by machining, or any other suitable forming process, to minimize the contact area with the diaphragm, and hence provide limited and poor thermal contact area between the diaphragm 76 and the low CTE material layer 78. As may be realized, the low CTE material of layer 78 may also have a poor thermal conduction coefficient. In the exemplary embodiment shown in FIG. 15, the contact surface 78S has raised projections that contact the diaphragm 76. The projections are shown schematically in FIG. 15, and may have any suitable shape. For example the projections may have a cross-section that tapers in to contact the diaphragm. The number and size of projections may be as desired to achieve desired load capacity and thermal conduction properties across the diaphragm/low CTE material layer interface. As may be realized, the thermal break provided by the isolation system 72 allows for rapid thermal cycling of the heater 32, chuck 21 and wafer stack 430.

Referring again to FIG. 8, in the exemplary embodiment the upper block assembly 20 is generally similar to the lower block assembly 22 described before. In the exemplary embodiment, the upper block provides the control level surface for stack bonding and the leveling system 82 operates to level the wafer support surface 21S of the lower block assembly to the wafer support surface 23S of the upper block assembly as previously described. In alternate embodiments, the upper block assembly 20 may have an integral leveling system. In this embodiment upper block assembly 20 is not movable. In other embodiments, similar to block assembly 22, the upper block assembly 20 may have a movable portion 20M, with chuck 23, heater 30 and support flange 34 (similar to heater 32 and flange 36 of the lower block) that is actuated in the direction indicated by arrow P1 by actuator 50. As seen in FIG. 8, in the exemplary embodiment a load bearing vacuum thermal isolation system 70, similar to previously described system 72, defines a thermal break between heater 30 and flange 34. The actuator 50 in the alternated embodiment may also be similar to actuator 52. The actuator 50 may have a plate member 57 and reaction or base member 55 joined to the plate member by bellow seals 53B, as shown in FIG. 16. In the exemplary embodiment, the bellow seals 53B is configured to support the movable portion 20M from the base member 55 under static conditions. Preload blocks 59 may be provided for preloading the bellows 53B during static conditions, in order to provide improved control of plate member displacement during actuator operation (e.g. preload blocks counter spring forces in bellows due to weight of movable portion of upper block assembly). As seen in FIG. 8, in the exemplary embodiment, the base member 51 of the actuator is connected to and supported from span member 53 by connection section 102. Connection section 102 is substantially rigid in axis z, in order to transfer z loads between the base member 51 and the span member 53 without any substantial elongation. During the bonding process, the connection section 102 behaves as a pinned connection, and hence is unable to transfer bonding moments. In the exemplary embodiment shown in FIG. 8, the connection section 102 includes an annular shell or wall 102w joined at one end 103 to the base member 55. The wall 102W has a flange 106 that extends between wall 102w and span member 53 and joins the wall 102W to the span member 53. Flange 106 may be formed integral to the wall 102w or to the span member 53.

The flange thickness is similar to the thickness of the span member at the interface between flange and span member. If integrally formed with the span member 53, the flange 106 is joined in any desired manner, (e.g. welding) to the wall 102W and vice versa. The flange 106 serves to offset the wall 102w from the span member 53 and hence, reduces the flexural stiffness of the wall 102w to span member 53 joint and renders the wall 102w substantially unable to transfer bonding loads between actuator base member 51 and span member 53. As may be realized, this allows the base member 51 to remain substantially flat when the actuator is pressurized for bonding the wafer stack in the chamber.

Several embodiments of the present invention have been described. Nevertheless, it will be understood that various modifications is made without departing from the spirit and scope of the invention. Accordingly, other embodiments are within the scope of the following claims.

What is claimed is:

1. An apparatus for bonding semiconductor structures comprising:
   equipment for positioning a first surface of a first semiconductor structure directly opposite, parallel and in contact with a first surface of a second semiconductor structure;
   equipment for forming a bond interface area between said first surfaces of said first and second semiconductor structures by pressing said first and second semiconductor structures together with a force column, wherein said force column applies a uniformly distributed load across the entire bond interface area during the entire bonding process, thereby resulting in uniform displacement, uniform stresses and uniform bonding pressure across the entire bond interface area; and
   wherein said force column comprises a plurality of uniformly distributed forces arranged in a column having a base dimensioned to match the entire bond interface area between said first surfaces.

2. The apparatus of claim 1 wherein said base's dimensions are adjustable.

3. The apparatus of claim 2 wherein said base's dimensions are adjusted to match said bond interface area comprising one of 4 inches, 6 inches or 8 inches diameter.

4. The apparatus of claim 1 wherein said force column applies said load to the entire bond interface area with a uniformity of at least 90 percent.

5. The apparatus of claim 1 wherein said resulting bonding pressure is in the range of 1000 to 50000 mbars.

6. The apparatus of claim 5 wherein said actuator comprises a solid plate driven by a pressurized gas.

7. The apparatus of claim 1 wherein said bond forming equipment comprises an actuator configured to generate said force column.

8. The apparatus of claim 7 wherein said actuator comprises a solid plate driven by at least one of pressurized fluid or a magnet.

9. The apparatus of claim 1 wherein said positioning equipment comprises a clamp having a first clamp member configured to be brought in contact with a second surface of said first semiconductor structure and a second clamp member configured to be brought in contact with a second surface of said second semiconductor structure, wherein said second surfaces of said first and second semiconductor structures are opposite to said first surfaces of said first and second semiconductor structures, respectively.

10. The apparatus of claim 9 wherein said pressing said first and second semiconductor structures together with said force column comprises pressing at least one of said first and second clamp members with said force column.

11. The apparatus of claim 9 further comprising a frame wherein said frame is configured to bear the load of said positioning and bond forming equipment.

12. The apparatus of claim 11 wherein said frame comprises at least one rigid post and wherein said first and second clamp members are configured to be connected to said post so as to transfer any bending moments generated during the bonding of the semiconductor structures to said frame.

13. The apparatus of claim 12 wherein any or both of said first and second clamp members are movably connected to said rigid post.

14. The apparatus of claim 13 wherein said frame comprises three rigid posts.

15. The apparatus of claim 14 wherein said frame further comprises top and bottom plates and said plates are connected to said rigid posts.

16. The apparatus of claim 15 further comprising a controlled atmosphere chamber.

17. The apparatus of claim 16 further comprising a carrier fixture configured to transport said first and second semiconductor structures in and out of said chamber and to place said first and second semiconductor structures between said clamp members.

18. The apparatus of claim 17 wherein said carrier fixture comprises at least one spacer configured to maintain said first surfaces of said first and second semiconductor structures at a first distance.

19. The apparatus of claim 18 wherein said carrier fixture further comprises at least one clamp for clamping said first and second semiconductor structures together.

20. The apparatus of claim 19 wherein said at least one spacer and said at least one clamp are independently actuated.

21. The apparatus of claim 20 further comprising a pin configured to stake said first surfaces of said first and second semiconductor structures before pressing said first and second semiconductor structures together with said force column.

22. The apparatus of claim 21 wherein said pin stakes said first surfaces of said first and second semiconductor structures with an adjustable force.

23. The apparatus of claim 16 further comprising a pressure gauge configured to monitor pressure in said chamber.

24. The apparatus of claim 17 wherein said chamber comprises a port dimensioned to allow transport of said carrier fixture in and out of said chamber.

25. The apparatus of claim 24 further comprising a pre-load chamber configured to communicate with said chamber via said port and wherein said port comprises a shutter for isolating said pre-load chamber from said chamber.

26. The apparatus of claim 9 further comprising:
   equipment for aligning a first surface of said first clamp member parallel to a first surface of said second clamp member, wherein said first surface of said first clamp member is configured to be brought in contact with said second surface of said first semiconductor structure and said first surface of said second clamp member is configured to be brought in contact with said second surface of said second semiconductor structure.

27. The apparatus of claim 26 wherein said aligning equipment is configured to align said first surfaces of said first and second semiconductor structures so that said force column is applied perpendicular to said bond interface area.

28. The apparatus of claim 27 wherein said aligning equipment comprises a linear alignment tool.

29. The apparatus of claim 28 wherein said aligning equipment further comprises a rotational alignment tool.

30. The apparatus of claim 29 wherein said rotational aligning equipment is configured to rotationally align any of said first surfaces around a center of said bond interface area.

31. The apparatus of claim 1 further comprising equipment for heating said first and second semiconductor structures to reach a temperature uniformity of ±1 degree throughout the entire bond interface area.

32. The apparatus of claim 31 further comprising a thermal isolation system configured to thermally isolate said first and second semiconductor structures from said positioning and bond forming equipment.

33. The apparatus of claim 32 wherein said thermal isolation system comprises a vacuum isolation layer confined between an elastic membrane and a substrate comprising a low CTE material.

34. The apparatus of claim 33 wherein said substrate comprises a surface structured to minimize contact with said membrane.

35. The apparatus of claim 31 wherein said heating equipment comprises independently controlled multi-zone heaters configured to independently control heating of center and periphery regions of said first and second semiconductor structures.

36. The apparatus of claim 31 wherein said heating equipment comprises a first set of heaters configured to heat said first semiconductor substrate and a second set of heaters configured to heat said second semiconductor substrate and wherein said first set of heaters is arranged in a mirror image configuration of said second set of heaters.

37. The apparatus of claim 1, wherein said semiconductor structures comprise one of semiconductor wafers, flat panel structures, integrated circuit devices, 3D integrated microelectronics or Micro-Electro-Mechanical-Systems (MEMS).

38. The apparatus of claim 1, wherein said first surfaces of said first and second semiconductor structures further comprise first and second bond layers, respectively, and wherein said first and second bond layers comprise at least one of metal, semiconductor, insulator, adhesive, grid structures, glass, or insulators.

39. The apparatus of claim 1, wherein said bonding comprises one of anodic, eutectic, adhesive, fusion, glass frit or thermocompression bond.

* * * * *